(12) United States Patent
Kondo et al.

(10) Patent No.: US 11,495,563 B2
(45) Date of Patent: Nov. 8, 2022

(54) SEMICONDUCTOR DEVICE

(71) Applicant: Murata Manufacturing Co., Ltd., Kyoto-fu (JP)

(72) Inventors: Masao Kondo, Nagaokakyo (JP); Kenji Sasaki, Nagaokakyo (JP); Shigeki Koya, Nagaokakyo (JP); Shinnosuke Takahashi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 29 days.

(21) Appl. No.: 16/994,187

(22) Filed: Aug. 14, 2020

(65) Prior Publication Data
US 2021/0098403 A1   Apr. 1, 2021

(30) Foreign Application Priority Data

Sep. 30, 2019   (JP) .............................. JP2019-179339

(51) Int. Cl.
*H01L 23/00* (2006.01)
*H03F 1/56* (2006.01)
*H03F 3/20* (2006.01)

(52) U.S. Cl.
CPC .............. *H01L 24/13* (2013.01); *H01L 24/16* (2013.01); *H01L 2224/13013* (2013.01); *H01L 2224/13025* (2013.01); *H01L 2224/16227* (2013.01); *H01L 2924/10329* (2013.01); *H01L 2924/10337* (2013.01); *H01L 2924/13051* (2013.01); *H01L 2924/19042* (2013.01); *H01L 2924/19103* (2013.01); *H01L 2924/30101* (2013.01); *H01L 2924/30107* (2013.01); *H03F 1/56* (2013.01); *H03F 3/20* (2013.01);
(Continued)

(58) Field of Classification Search
None
See application file for complete search history.

(56) References Cited

U.S. PATENT DOCUMENTS

| 10,192,862 B2 * | 1/2019 | Sasaki ..................... H01L 24/05 |
| 2005/0104685 A1 | 5/2005 | Kuroki et al. |
| 2019/0148172 A1 | 5/2019 | Shimamoto |

FOREIGN PATENT DOCUMENTS

| JP | 2018-032848 A | 3/2018 |
| TW | 200520201 A | 6/2005 |
| TW | 201904012 A | 1/2019 |

OTHER PUBLICATIONS

An Office Action issued by Taiwan Intellectual Property Office dated May 12, 2021, which corresponds to Taiwanese Patent Application No. 109127060 and is related to U.S. Appl. No. 16/994,187; with English language translation.

* cited by examiner

Primary Examiner — Long Pham
(74) Attorney, Agent, or Firm — Studebaker & Brackett PC

(57) ABSTRACT

Two transistor rows are arranged on or in a substrate. Each of the two transistor rows is configured by a plurality of transistors aligned in a first direction, and the two transistor rows are arranged at an interval in a second direction orthogonal to the first direction. A first wiring is arranged between the two transistor rows when seen from above. The first wiring is connected to collectors or drains of the plurality of transistors in the two transistor rows. The first bump overlaps with the first wiring when seen from above, is arranged between the two transistor rows, and is connected to the first wiring.

20 Claims, 22 Drawing Sheets

(52) U.S. Cl.
CPC .. *H03F 2200/222* (2013.01); *H03F 2200/318* (2013.01); *H03F 2200/387* (2013.01)

SEMICONDUCTOR DEVICE

CROSS-REFERENCE TO RELATED APPLICATION

This application claims benefit of priority to Japanese Patent Application No. 2019-179339, filed Sep. 30, 2019, the entire content of which is incorporated herein by reference.

BACKGROUND

Technical Field

The present disclosure relates to a semiconductor device.

Background Art

A semiconductor chip in which a heterojunction bipolar transistor is provided is used as a power amplification circuit element of a portable terminal or the like. The semiconductor chip is flip-chip mounted on a mounting substrate with a plurality of bumps interposed therebetween, the bumps being provided on a surface of the semiconductor chip. Such a mounting form is also referred to as face-down mounting. A semiconductor chip for a power amplification circuit, which is flip-chip mounted, is described in, for example, U.S. Patent Application Publication No. 2019/0148172, or the like.

In the semiconductor chip described in U.S. Patent Application Publication No. 2019/0148172, transistors include a plurality of fingers (which may also be referred to as "cells"). Considering one finger as one transistor, it can be said that a plurality of transistors is arranged in at least two rows. The transistor rows are arranged in parallel to each other. Two emitter bumps are arranged so as to overlap with the two transistor rows, respectively. A collector wiring is arranged in a region between the two transistor rows. The collector wiring extends from the region between the two transistor rows to an outer side portion thereof in the array direction of the transistors. A collector bump is arranged in the outer side region and is connected to the collector wiring in the outer side region.

In the semiconductor chip described in U.S. Patent Application Publication No. 2019/0148172, the collector wiring for connecting the collector bump and the collectors of the transistors is arranged between the two transistor rows, and the collector bump is arranged in the outer side portion of the region. A collector current flows from the collector bump to the collectors of the respective transistors through the collector wiring in the region between the two transistor rows. Since the collector current flows through the collector wiring in the array direction of the plurality of transistors, parasitic inductance and parasitic resistance in a path of the collector current are likely to increase. When the same structure is employed while using field effect transistors as the transistors, parasitic inductance and parasitic resistance in a path of a drain current are likely to increase. The parasitic inductance and the parasitic resistance cause decrease in maximum output of the amplification circuit.

SUMMARY

Accordingly, the present disclosure provides a semiconductor device capable of suppressing increase in parasitic inductance and parasitic resistance in a path of a collector current or a drain current.

According to one aspect of the present disclosure, there is provided a semiconductor device including a substrate; and two transistor rows that are provided on or in the substrate. Each of the two transistor rows is configured by a plurality of transistors aligned in a first direction and the two transistor rows are arranged at an interval in a second direction orthogonal to the first direction. The semiconductor device further includes a first wiring that is arranged in a region between the two transistor rows when seen from above and is connected to collectors or drains of the plurality of transistors in the two transistor rows; and at least one first bump that overlaps with the first wiring when seen from above, is arranged between the two transistor rows, and is connected to the first wiring.

Other features, elements, characteristics and advantages of the present disclosure will become more apparent from the following detailed description of preferred embodiments of the present disclosure with reference to the attached drawings.

DETAILED DESCRIPTION

First Embodiment

A semiconductor device according to a first embodiment will be described with reference to the drawings of FIGS. 1 to 5.

Figure 1:
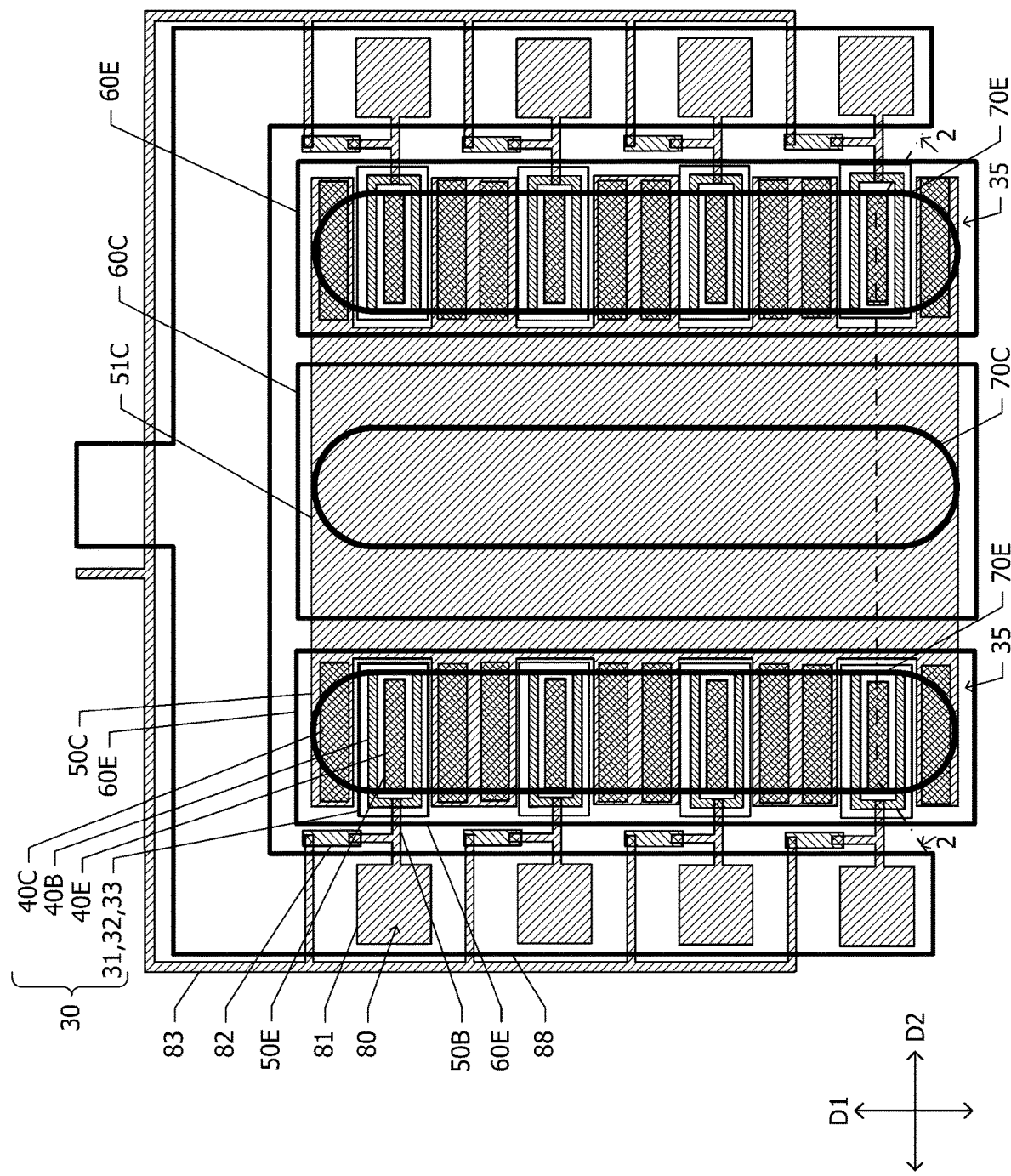
FIG. 1 is a view illustrating a positional relationship of a plurality of constituent elements of a semiconductor device according to a first embodiment when seen from above.

FIG. 1 is a view illustrating a positional relationship of a plurality of constituent elements of the semiconductor device according to the first embodiment when seen from above. Two transistor rows 35 are arranged on or in a substrate made of a semiconductor. Each of the two transistor rows 35 includes a plurality of bipolar transistors 30 aligned in a first direction D1. The two transistor rows 35 are arranged at an interval in a second direction D2 orthogonal to the first direction D1.

Each of the bipolar transistors 30 includes a collector layer 31, a base layer 32, and an emitter layer 33. The outer circumferential lines of the collector layer 31, the base layer 32, and the emitter layer 33 substantially coincide with one another when seen from above. In one bipolar transistor 30, two collector electrodes 40C are arranged at positions interposing the collector layer 31 in the first direction D1. The collector electrodes 40C are electrically connected to the collector layer 31 with a sub-collector layer provided in a surface layer portion of the substrate interposed therebetween. The sub-collector layer will be described later with reference to FIG. 2.

Base electrodes 40B are electrically connected to the base layers 32, and emitter electrodes 40E are electrically connected to the emitter layers 33. Each of the emitter electrodes 40E has a substantially elongated shape in the second direction D2 when seen from above and is encompassed in the emitter layer 33. The base electrodes 40B surround the emitter electrodes 40E from three directions when seen from above, have substantially U shapes that are opened toward a region between the two transistor rows 35, and are encompassed in the base layers 32. In FIG. 1, the collector electrodes 40C, the base electrodes 40B, and the emitter electrodes 40E are marked with relatively high-density right-upward hatching.

In a first wiring layer on the substrate, a plurality of collector extended wirings 50C, a collector wiring 51C (first wiring), a plurality of emitter wirings 50E, a plurality of base wirings 50B, a plurality of capacitor lower electrodes 81, and a bias input wiring 83 are arranged. In FIG. 1, the wirings in the first wiring layer are marked with relatively low-density right-downward hatching.

The plurality of collector extended wirings 50C is extended from the collector electrodes 40C toward the region between the two transistor rows 35. The collector extended wirings 50C extended from the two collector electrodes 40C arranged between the collector layers 31 of the two bipolar transistors 30 adjacent in the first direction D1 are gathered into one wiring. The collector wiring 51C is arranged in the region between the two transistor rows 35 and is connected to the plurality of collector extended wirings 50C that are respectively extended from the collector electrodes 40C of the plurality of bipolar transistors 30 included in the two transistor rows 35.

The plurality of emitter wirings 50E is arranged at positions overlapping with the emitter electrodes 40E when seen from above so as to respectively correspond to the emitter electrodes 40E. The emitter wirings 50E are connected to the corresponding emitter electrodes 40E. What two constituent elements overlap with each other when seen from above in the specification means, unless otherwise specified, that at least a part of one constituent element overlaps with at least a part of the other constituent element when seen from above.

The plurality of base wirings 50B is respectively extended from the base electrodes 40B in the direction away from the region between the two transistor rows 35. The plurality of capacitor lower electrodes 81 is arranged side by side in the first direction D1 in outer side portions of the two transistor rows 35. The plurality of capacitor lower electrodes 81 is connected to the base electrodes 40B of the bipolar transistors 30 with the base wirings 50B interposed therebetween, respectively. Further, the plurality of base wirings 50B is connected to the bias input wiring 83 with resistor elements 82 interposed therebetween, respectively. A base current is supplied from the bias input wiring 83 to the base electrodes 40B of the bipolar transistors 30 while passing through the resistor elements 82 and the base wirings 50B.

Two emitter wirings 60E, one collector wiring 60C, and a radio frequency signal input wiring 88 are arranged in a second wiring layer on the substrate. The two emitter wirings 60E are respectively arranged at positions overlapping with the two transistor rows 35 and have substantially elongated shapes in the first direction D1 when seen from above. The collector wiring 60C is arranged between the two transistor rows 35 and has a substantially elongated shape in the first direction D1 when seen from above.

The radio frequency signal input wiring 88 overlaps with the plurality of capacitor lower electrodes 81. Overlapping portions of them constitute input capacitors 80. A radio frequency input signal is supplied to the base electrodes 40B after passing through the radio frequency signal input wiring 88, the input capacitors 80, and the base wirings 50B.

Emitter bumps 70E are arranged so as to overlap with the two emitter wirings 60E, respectively. A collector bump 70C (first bump) is arranged so as to overlap with the collector wiring 60C. Each of the emitter bumps 70E and the collector bump 70C have shapes (for example, substantially oval shapes, substantially elliptical shapes, or substantially racetrack shapes) elongated in the first direction D1 when seen from above.

The emitter electrodes 40E of the plurality of bipolar transistors 30 are grounded with the emitter wirings 50E and 60E and the emitter bumps 70E interposed therebetween. The collector electrodes 40C of the plurality of bipolar transistors 30 are connected to the collector bump 70C with the collector extended wirings 50C, the collector wiring 51C, and the collector wiring 60C interposed therebetween.

Figure 2:
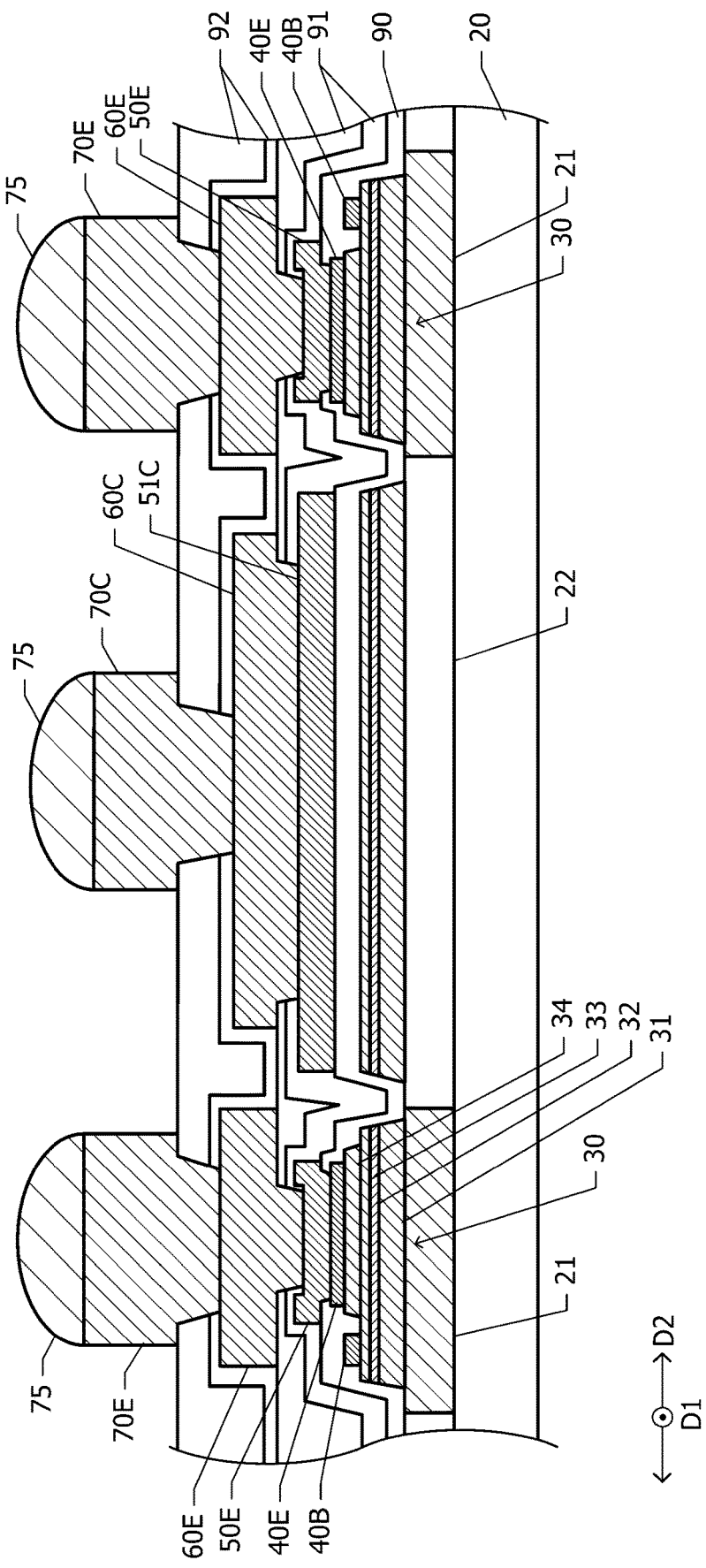
FIG. 2 is a cross-sectional view taken along a dashed-dotted line 2-2 in FIG. 1.

FIG. 2 is a cross-sectional view taken along a dashed-dotted line 2-2 in FIG. 1. Sub-collector layers 21 are arranged on or above partial regions of the upper surface of the substrate 20. As the substrate 20, for example, a semi-insulating GaAs substrate is used. The sub-collector layers 21 are, for example, in an n-type GaAs layer epitaxially grown on the substrate 20. A portion of the n-type GaAs layer other than the sub-collector layers 21 serves as an element isolation region 22 insulated by ion implantation.

On the sub-collector layers 21, the collector layers 31, the base layers 32, and the emitter layers 33 are laminated in this order. For example, the collector layers 31 are formed of n-type GaAs, the base layers 32 are formed of p-type GaAs, and the emitter layers 33 are formed of n-type InGaP. Emitter mesa layers 34 are arranged on or above partial regions of the upper surface of the emitter layers 33. The emitter mesa layers 34 have two-layer structures in which cap layers and contact layers are laminated in this order. For example, the cap layers are formed of n-type GaAs, and the contact layers are formed of n-type InGaAs. Regions of the emitter layers 33, which overlap with the emitter mesa layers 34 when seen from above, function as emitter regions of the bipolar transistors 30, and the other regions thereof are depleted. Portions of the emitter layers 33, which function as the emitter regions, may be referred to as intrinsic emitter layers, and portions thereof, which are depleted, may be referred to as ledge layers.

The base electrodes 40B are arranged on or above regions of the upper surfaces of the emitter layers 33 in which the emitter mesa layers 34 are not arranged. The base electrodes 40B are electrically connected to the base layers 32 with alloying regions, which penetrate through the emitter layers 33 and reach the base layers 32, interposed therebetween. The emitter electrodes 40E are arranged on or above the emitter mesa layers 34. The emitter electrodes 40E are electrically connected to the emitter layers 33 with the emitter mesa layers 34 interposed therebetween.

On the element isolation region 22 between the two transistor rows 35 (FIG. 1), semiconductor layers formed by the same processes as those of the collector layers 31, the base layers 32, and the emitter layers 33 are left.

An insulating film 90 is arranged over or above the entire region of the substrate 20 so as to cover the base electrodes 40B, the emitter electrodes 40E, and the semiconductor layers left on the element isolation region 22. The emitter wirings 50E and the collector wiring 51C of the first layer are arranged on or above the insulating film 90. The emitter wirings 50E are connected to the emitter electrodes 40E through cavities provided in the insulating film 90. The collector wiring 51C is electrically connected to the collector electrodes 40C (FIG. 1) with the collector extended wirings 50C interposed therebetween in regions that are not illustrated in the cross section in FIG. 2.

An insulating film 91 is arranged over or above the entire region of the substrate 20 so as to cover the emitter wirings 50E and the collector wiring 51C of the first layer. The insulating film 91 includes, for example, two layers of a SiN film on the lower side and a polyimide film thereon.

The emitter wirings 60E and the collector wiring 60C of the second layer are arranged on or above the insulating film 91. The emitter wirings 60E of the second layer are connected to the emitter wirings 50E of the first layer through cavities provided in the insulating film 91. The collector wiring 60C of the second layer is connected to the collector wiring 51C of the first layer through a cavity provided in the insulating film 91.

An insulating film 92 is arranged over or above the entire region of the substrate 20 so as to cover the emitter wirings 60E and the collector wiring 60C of the second layer. The insulating film 92 includes, for example, two layers of a SiN film on the lower side and a polyimide film thereon.

The emitter bumps 70E and the collector bump 70C are arranged on or above the insulating film 92. The emitter bumps 70E are connected to the emitter wirings 60E of the second layer through cavities provided in the insulating film 92. The collector bump 70C is connected to the collector wiring 60C of the second layer through a cavity provided in the insulating film 92. A solder layer 75 is arranged on each of the emitter bumps 70E and the collector bump 70C.

Figure 3:
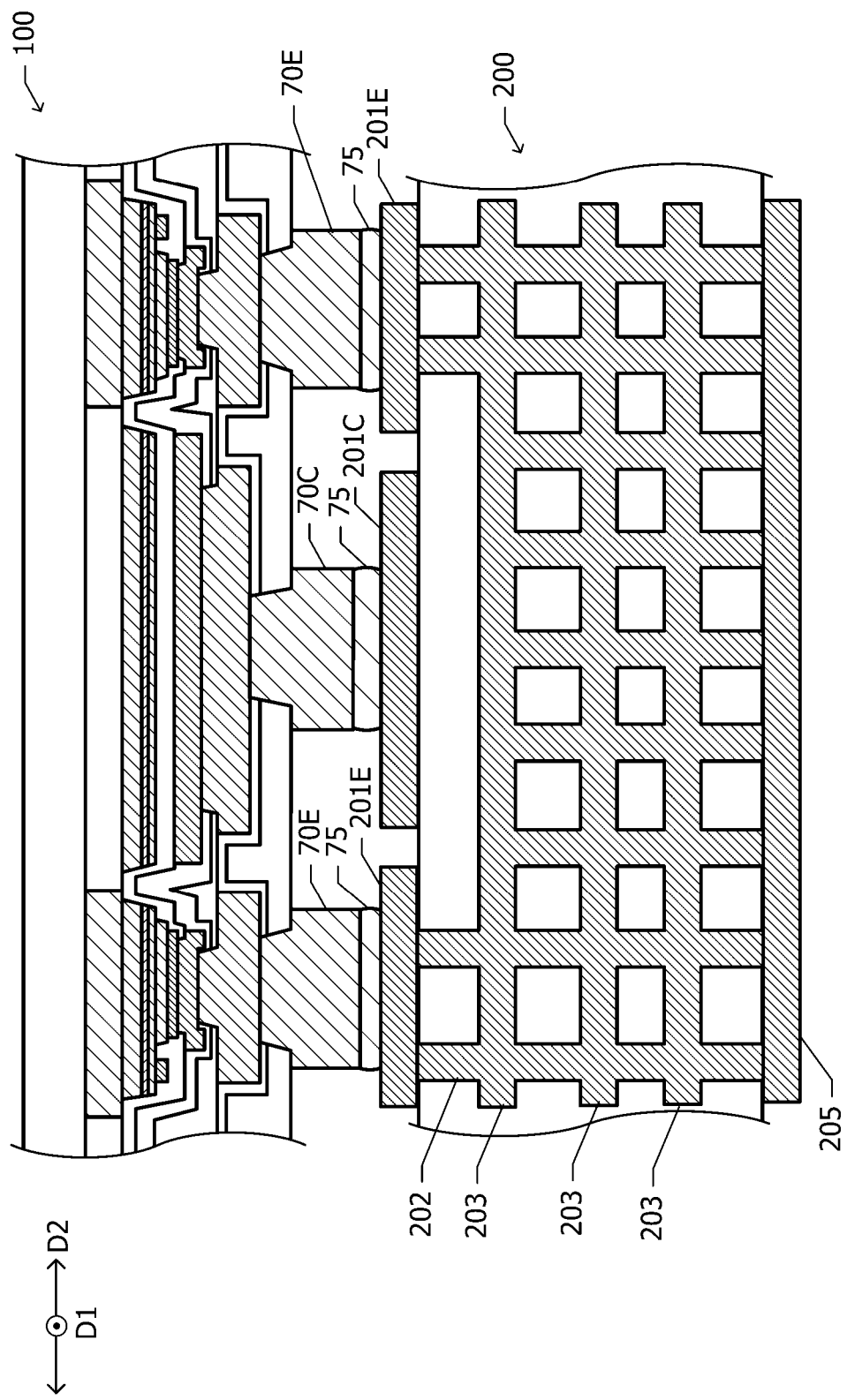
FIG. 3 is a cross-sectional view of a power amplification module including the semiconductor device illustrated in FIGS. 1 and 2.

FIG. 3 is a cross-sectional view of a power amplification module including the semiconductor device illustrated in FIGS. 1 and 2. The semiconductor device illustrated in FIGS. 1 and 2 is provided as one semiconductor chip 100. The semiconductor chip 100 is flip-chip mounted on a mounting substrate 200.

As the mounting substrate 200, for example, a printed board is used. The mounting substrate 200 may also be referred to as a module substrate or a package substrate. A plurality of emitter lands 201E and a collector land 201C are provided on one surface (hereinafter, referred to as an upper surface) of the mounting substrate 200. The emitter bumps 70E and the collector bump 70C of the semiconductor chip 100 are connected to the emitter lands 201E and the collector land 201C with the solder layers 75 interposed therebetween, respectively.

A plurality of ground planes 203 is arranged in inner layers of the mounting substrate 200. Further, a ground plane 205 is arranged also on the lower surface of the mounting substrate 200 on the side opposite to the upper surface thereof. The emitter lands 201E are connected to the plurality of ground planes 203 of the inner layers and the ground plane 205 on the lower surface with a plurality of via conductors 202 interposed therebetween.

Figure 4:
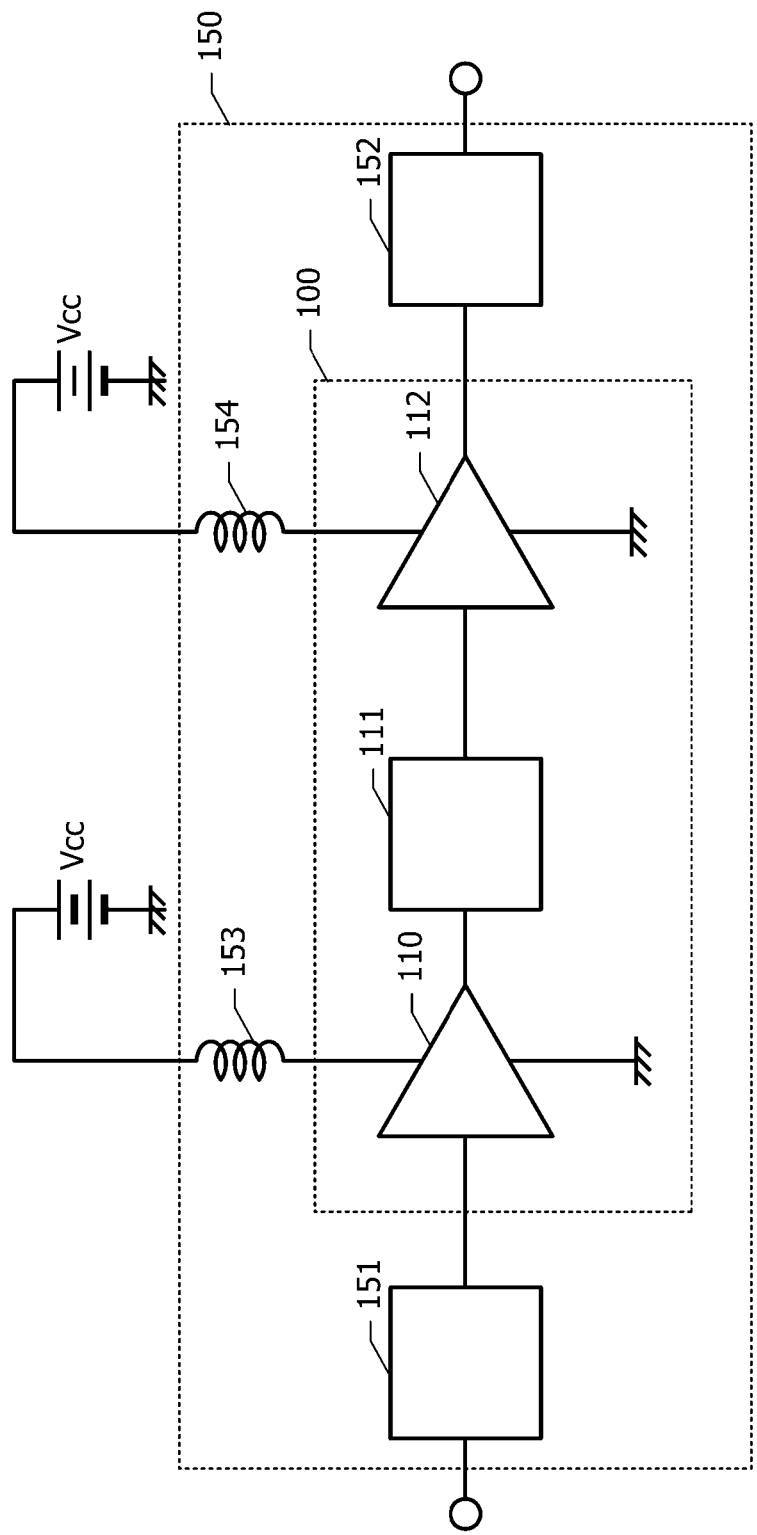
FIG. 4 is a block diagram of the power amplification module including the semiconductor device according to the first embodiment.

FIG. 4 is a block diagram of a power amplification module 150 including the semiconductor device according to the first embodiment. The term "semiconductor device" used in the specification refers to a semiconductor chip in which an amplification circuit is arranged or an amplification circuit module including the semiconductor chip, circuit components, and a mounting substrate on which the semiconductor chip and the circuit components are mounted. The power amplification module 150 includes the semiconductor chip 100, an input-side impedance matching circuit 151, an output-side impedance matching circuit 152, and inductors 153 and 154. These circuit components are mounted on the mounting substrate 200 (FIG. 3).

The semiconductor chip 100 includes a driver stage amplification circuit 110, an inter-stage impedance matching circuit 111, and a power stage amplification circuit 112. A power supply voltage Vcc is applied to the driver stage amplification circuit 110 with the inductor 153 interposed therebetween. The power supply voltage Vcc is applied to the power stage amplification circuit 112 with the inductor 154 interposed therebetween.

A radio frequency signal is input to the driver stage amplification circuit 110 with the input-side impedance matching circuit 151 interposed therebetween. The radio frequency signal amplified by the driver stage amplification circuit 110 is input to the power stage amplification circuit 112 with the inter-stage impedance matching circuit 111 interposed therebetween. The radio frequency signal amplified by the power stage amplification circuit 112 is output to an external device, for example, an antenna element, with the output-side impedance matching circuit 152 interposed therebetween.

The power stage amplification circuit 112 includes the plurality of bipolar transistors 30 illustrated in FIGS. 1 and 2. The emitter bumps 70E (FIG. 1 and FIG. 2) are grounded. The radio frequency signal is input to the radio frequency signal input wiring 88 (FIG. 1) with the inter-stage impedance matching circuit 111 interposed therebetween. The collector bump 70C (FIG. 1 and FIG. 2) is connected to the output-side impedance matching circuit 152 and is connected to the power supply voltage Vcc with the inductor 154 interposed therebetween. The inductor 154 functions as a choke coil for blocking the radio frequency signal.

Figure 5:
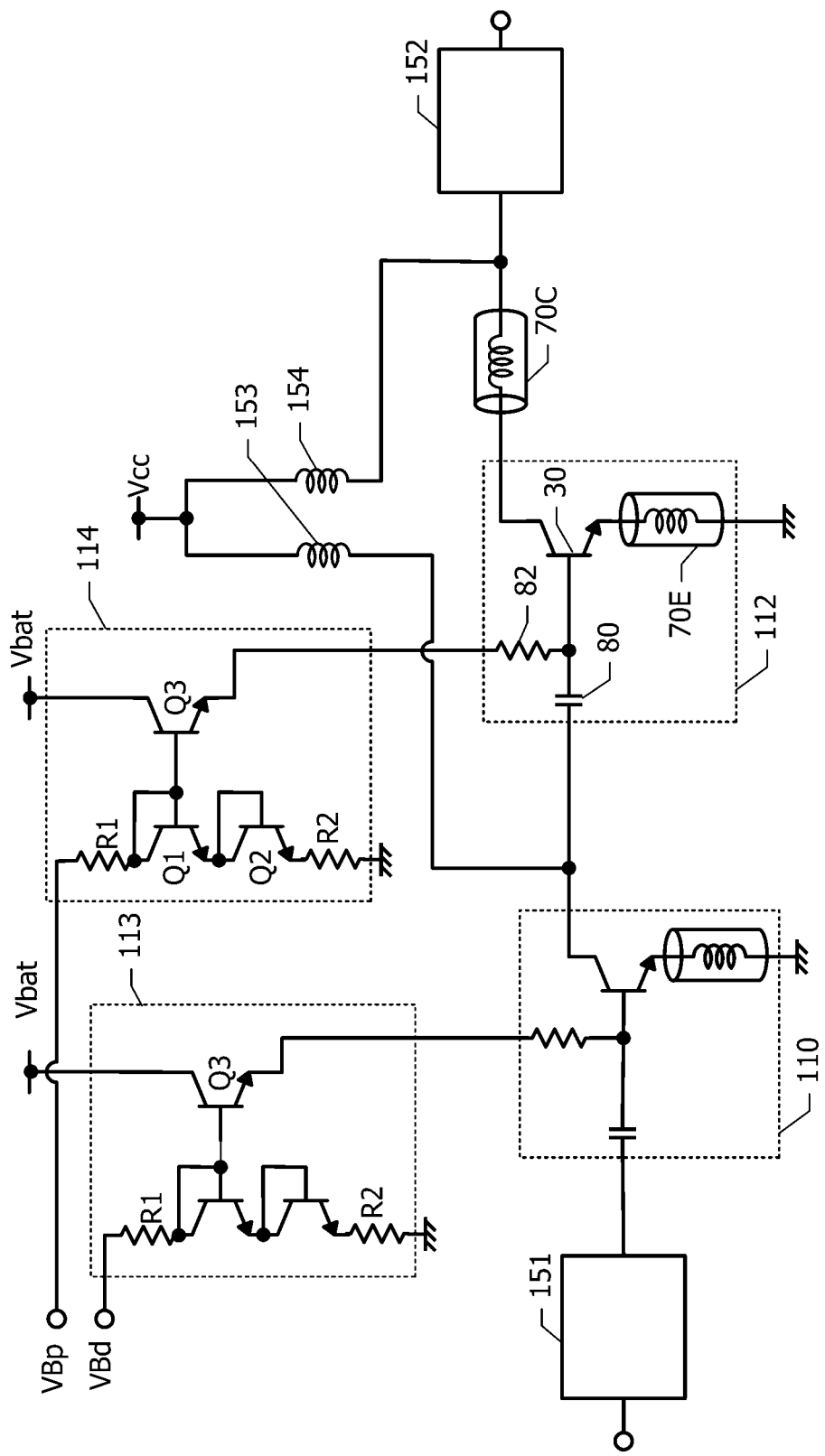
FIG. 5 is an equivalent circuit diagram of an amplification circuit module including the semiconductor device according to the first embodiment.

FIG. 5 is an equivalent circuit diagram of an amplification circuit module including the semiconductor device according to the first embodiment. The amplification circuit module according to the first embodiment includes the driver stage amplification circuit 110, the power stage amplification circuit 112, a driver stage bias circuit 113, a power stage bias circuit 114, the inductors 153 and 154, the input-side impedance matching circuit 151, and the output-side impedance matching circuit 152. In FIG. 5, inductors surrounded by columnar figures represent parasitic inductors of bumps.

The power stage amplification circuit 112 includes a plurality of unit cells each formed by the bipolar transistor 30, the input capacitor 80, and the resistor element 82. The plurality of unit cells is connected in parallel to each other. In FIG. 5, one of the plurality of unit cells is illustrated as a representative. The collector bump 70C is connected to the collectors of the bipolar transistors 30. The power supply voltage Vcc is applied to the collectors of the bipolar transistors 30 with the inductor 154 functioning as the choke coil and the collector bump 70C interposed therebetween.

A bias current is supplied from the power stage bias circuit 114 to the bases of the bipolar transistors 30 with the resistor elements 82 interposed therebetween. The power stage bias circuit 114 includes a resistor element R1, transistors Q1 and Q2, and a resistor element R2 connected in series between a bias control terminal VBp and the ground. Each of the transistors Q1 and Q2 is diode-connected and operates as a diode. The power stage bias circuit 114 further includes an emitter follower transistor Q3. The transistor Q1 and the emitter follower transistor Q3 constitute a current mirror. A bias voltage Vbat is applied to a collector of the emitter follower transistor Q3. An emitter of the emitter follower transistor Q3 is connected to the bases of the bipolar transistors 30 with the resistor elements 82 interposed therebetween. The power stage bias circuit 114 supplies, to the bipolar transistors 30, the bias current in accordance with a control voltage applied to the bias control terminal VBp.

The basic circuit configurations of the driver stage amplification circuit 110, the driver stage bias circuit 113, and the inductor 153 are the same as the circuit configurations of the power stage amplification circuit 112, the power stage bias circuit 114, and the inductor 154. However, the number of unit cells and the dimensions of the elements are different between the driver stage amplification circuit 110 and the power stage amplification circuit 112. In addition, the driver stage bias circuit 113 supplies a bias current in accordance with a control voltage applied to a bias control terminal VBd. In FIG. 5, illustration of a collector bump arranged between a collector of a bipolar transistor of the driver stage amplification circuit 110 and the inductor 153 is omitted.

A radio frequency input signal is input to the driver stage amplification circuit 110 with the input-side impedance matching circuit 151 interposed therebetween. The radio frequency signal amplified by the driver stage amplification circuit 110 is input to the bases of the bipolar transistors 30 with the input capacitors 80 of the power stage amplification circuit 112 interposed therebetween. The emitters of the bipolar transistors 30 are grounded with parasitic inductances of the emitter bumps 70E interposed therebetween.

Next, an excellent effect of the semiconductor device according to the first embodiment will be described as compared with a comparative example illustrated in FIGS. 6 and 7.

Figure 6:
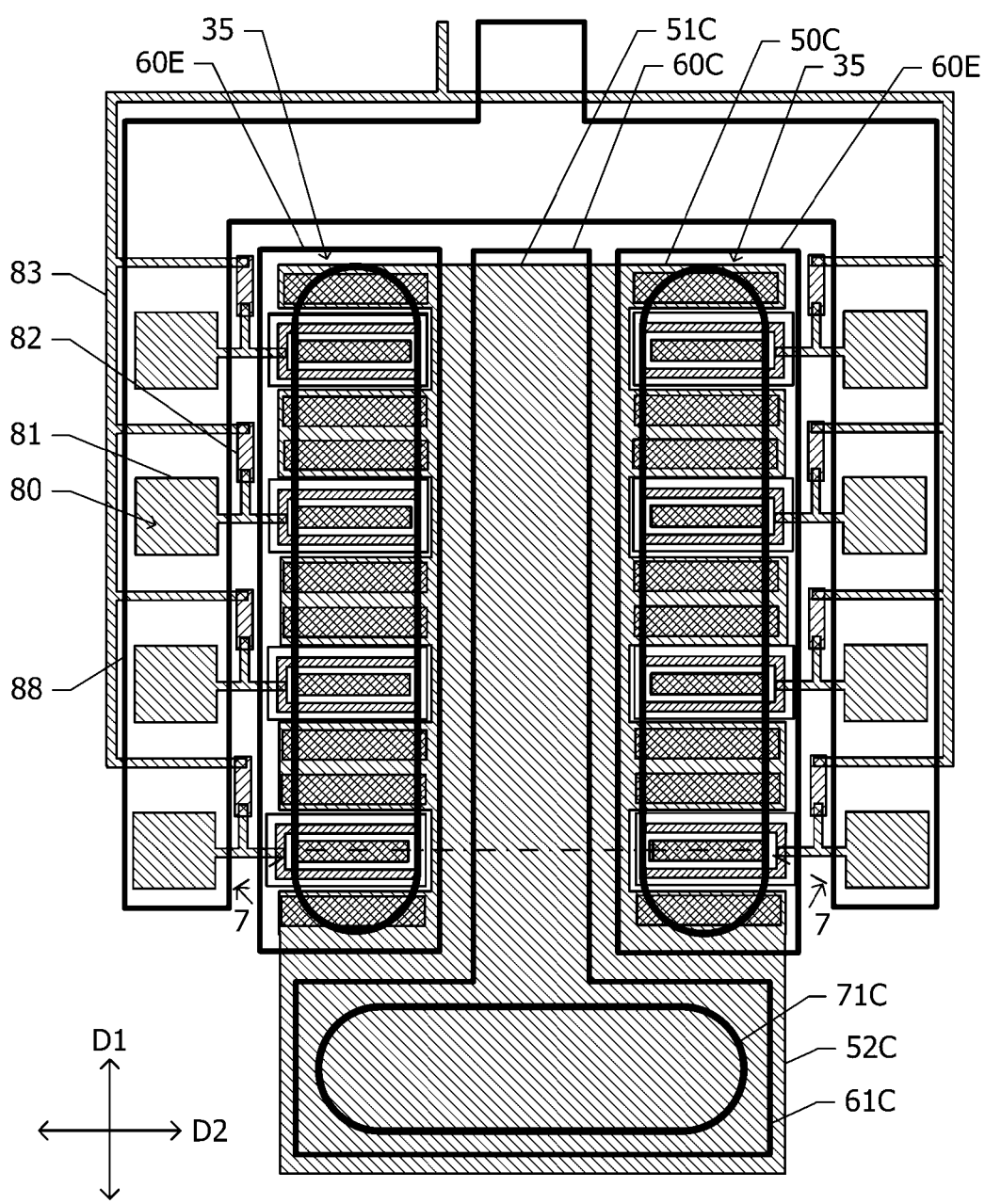
FIG. 6 is a view illustrating a positional relationship of a plurality of constituent elements of a semiconductor device according to a comparative example when seen from above.
Figure 7:
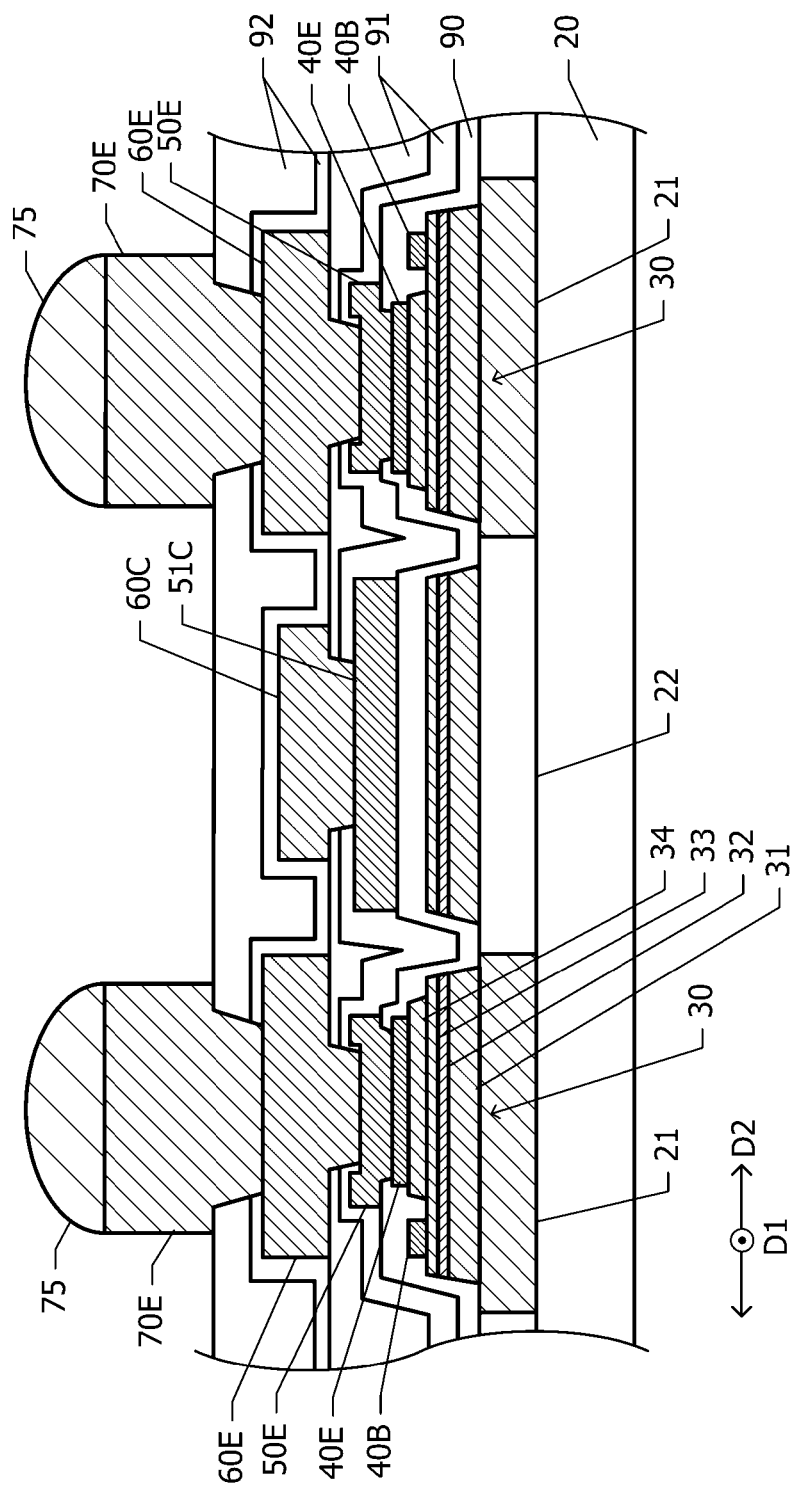
FIG. 7 is a cross-sectional view taken along a dashed-dotted line 7-7 in FIG. 6.

FIG. 6 is a view illustrating a positional relationship of a plurality of constituent elements of a semiconductor device according to the comparative example when seen from above, and FIG. 7 is a cross-sectional view taken along a dashed-dotted line 7-7 in FIG. 6. Hereinafter, different points from the semiconductor device (FIGS. 1 and 2) according to the first embodiment will be described. In the comparative example, collector wirings of the first layer include the collector wiring 51C arranged between the two transistor rows 35 and a collector wiring 52C extending from the collector wiring 51C toward one side in the first direction D1.

Collector wirings of the second layer also include the collector wiring 60C overlapping with the collector wiring 51C when seen from above and a collector wiring 61C overlapping with the collector wiring 52C in an extended portion. A collector bump 71C is arranged at a position overlapping with the collector wiring 61C in the extended portion, and no collector bump is arranged between the two transistor rows 35.

In the configuration of the comparative example, from the collector bump 71C to the collector electrodes 40C, a collector current flows through the collector wiring 51C of the first layer and the collector wiring 60C of the second layer in the first direction D1. A flow path of the collector current flowing in the first direction D1 is formed by only two layers of the collector wiring 51C of the first layer and the collector wiring 60C of the second layer, as illustrated in FIG. 7.

In contrast, in the first embodiment, the collector current flows through the collector land 201C (FIG. 3), the collector bump 70C (FIG. 3), the collector wiring 60C (FIG. 2) of the second layer, and the collector wiring 51C (FIG. 2) of the first layer in the first direction D1, and then, flows through the collector extended wirings 50C in the second direction D2 to reach the collector electrodes 40C. A flow path of the collector current flowing in the first direction D1 includes four layers of the collector land 201C, the collector bump 70C, the collector wiring 60C of the second layer, and the collector wiring 51C of the first layer. Dimensions of the flow path in the thickness direction and the second direction D2 are larger than those of the flow path in the semiconductor device according to the comparative example.

In the first embodiment, compared to the comparative example (FIGS. 6 and 7), since the flow path cross section of the path of the collector current flowing in the first direction D1 is large, it is possible to obtain an excellent effect that the parasitic resistance and the parasitic inductance of the path of the collector current are small. In particular, formation of the collector bump 70C into the substantially elongated shape in the first direction D1 can suppress variations in the parasitic resistance and the parasitic inductance among the plurality of bipolar transistors 30 and further reduce the parasitic resistance and the parasitic inductance. This makes it possible to suppress decrease in maximum output due to increase in the parasitic resistance or the parasitic inductance in the path of the collector current.

In order to obtain the above-described sufficient effect, it is preferable that an interval between the two transistor rows 35 in the second direction (an interval between the collector electrodes 40C of one transistor row 35 and the collector electrodes 40C of the other transistor row 35) be shorter than the length of each of the two transistor rows 35 in the first direction D1 (the length from the outer edge of one collector electrode 40C at an outermost position to the outer edge of the other collector electrode 40C at an outermost position). Further, it is preferable that the dimension of the collector bump 70C in the first direction D1 be equal to or larger than ¾ of the length of the transistor rows 35 in the first direction D1.

Next, a variation of the first embodiment will be described.

As will be described later with reference to FIG. 11, for example, a harmonic termination circuit may be connected to the collectors of the plurality of bipolar transistors 30 constituting the power stage amplification circuit 112 (FIG. 4). The harmonic termination circuit is constituted of, for example, a series circuit of a harmonic termination capacitor and a harmonic termination inductor. At least one of the harmonic termination capacitor and the harmonic termination inductor, that is, a passive element having at least one of inductance and capacitance may be arranged in an inner layer of the mounting substrate 200 (FIG. 3). The passive element is preferably arranged at a position overlapping with the collector land 201C (FIG. 3) when seen from above. It is therefore not necessary to secure a dedicated region for arranging the harmonic termination circuit when seen from above, thereby suppressing increase in the size of the power amplification module 150 (FIG. 4).

Next, another variation of the first embodiment will be described. In the first embodiment, the bipolar transistors 30 are used as active elements of the amplification circuit. However, field effect transistors may be used as the active elements. In this case, the "emitters", the "bases", and the "collectors" in the semiconductor device according to the first embodiment may be replaced with "sources", "gates", and "drains," respectively.

Second Embodiment

Next, a semiconductor device according to a second embodiment will be described with reference to FIG. 8. Hereinafter, description of configurations common to those of the semiconductor device (FIGS. 1 to 4) according to the first embodiment will be omitted.

Figure 8:
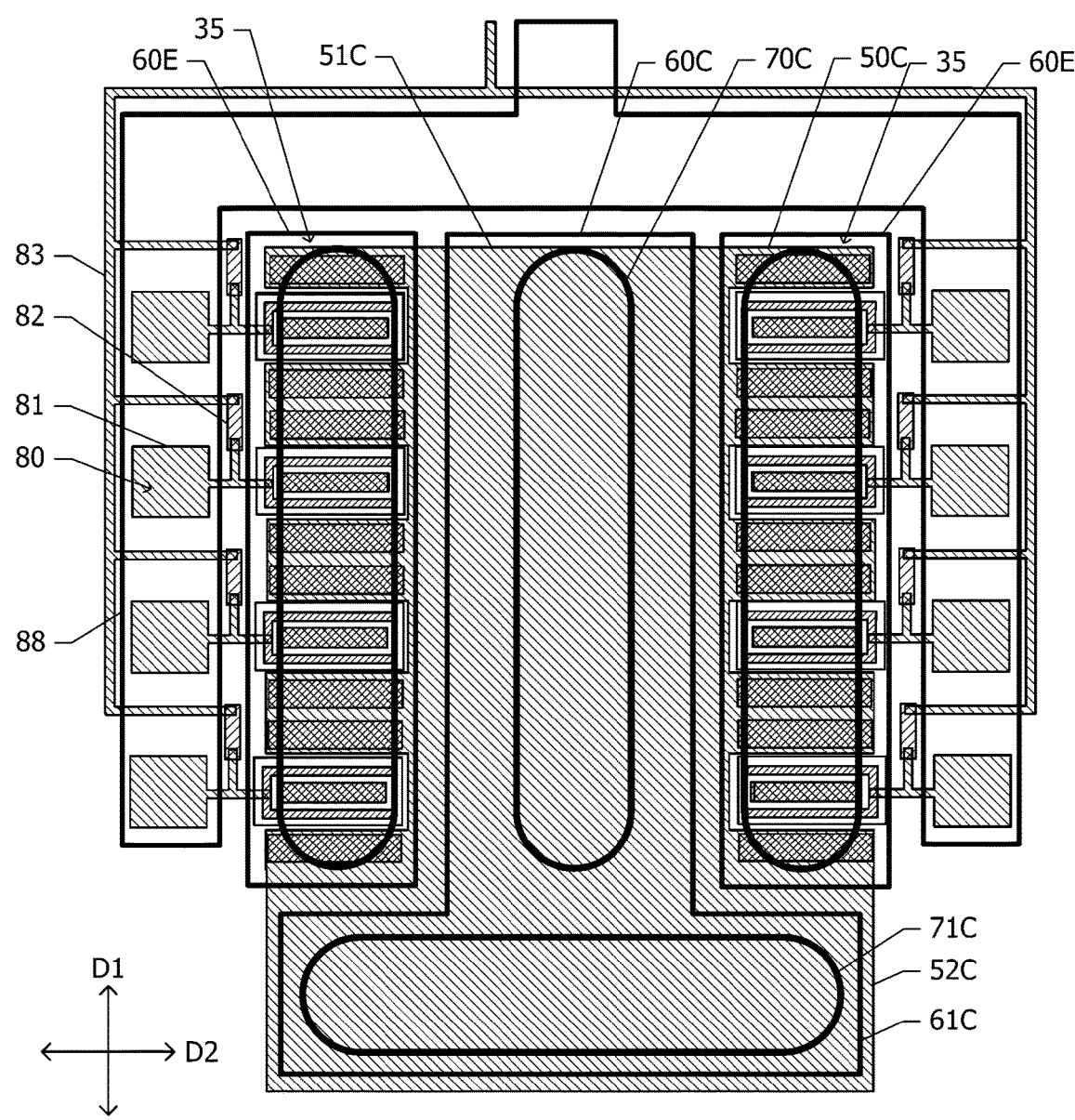
FIG. 8 is a view illustrating a positional relationship of a plurality of constituent elements of a semiconductor device according to a second embodiment when seen from above.

FIG. 8 is a view illustrating a positional relationship of a plurality of constituent elements of the semiconductor device according to the second embodiment when seen from above. In the first embodiment, the collector wiring 51C of the first layer and the collector wiring 60C of the second layer are within the region interposed between the two transistor rows 35. On the other hand, in the second embodiment, the collector wiring 52C of the first layer and the collector wiring 61C of the second layer are arranged also in an outer side portion of the region interposed between the two transistor rows 35. The collector wiring 52C of the first layer and the collector wiring 61C of the second layer have substantially elongated shapes in the second direction D2 when seen from above.

The collector wiring 52C is continuous to the collector wiring 51C in the region interposed between the two transistor rows 35. Similarly, the collector wiring 61C of the second layer is continuous to the collector wiring 60C in the region interposed between the two transistor rows 35. When the two transistor rows 35 are extended to one side in the first direction D1, they overlap with portions of the collector wiring 51C of the first layer and the collector wiring 61C of the second layer when seen from above.

The collector bump 71C is arranged so as to be encompassed in the collector wiring 61C of the second layer when seen from above. The collector bump 71C has a substantially elongated shape in the second direction D2 when seen from above.

Next, an excellent effect of the semiconductor device according to the second embodiment will be described.

In the second embodiment, as a path of a collector current, a path including the collector bump 70C (first bump) arranged in the region between the two transistor rows 35 and a path including the other collector bump 71C (another first bump) are formed. Parasitic resistance and parasitic inductance in the path of the collector current can be further reduced by connecting the two paths in parallel. As a result, it is possible to obtain an excellent effect that decrease in maximum output is suppressed.

Third Embodiment

Next, a semiconductor device according to a third embodiment will be described with reference to FIG. 9. Hereinafter, description of configurations common to those of the semiconductor device (FIG. 8) according to the second embodiment will be omitted.

Figure 9:
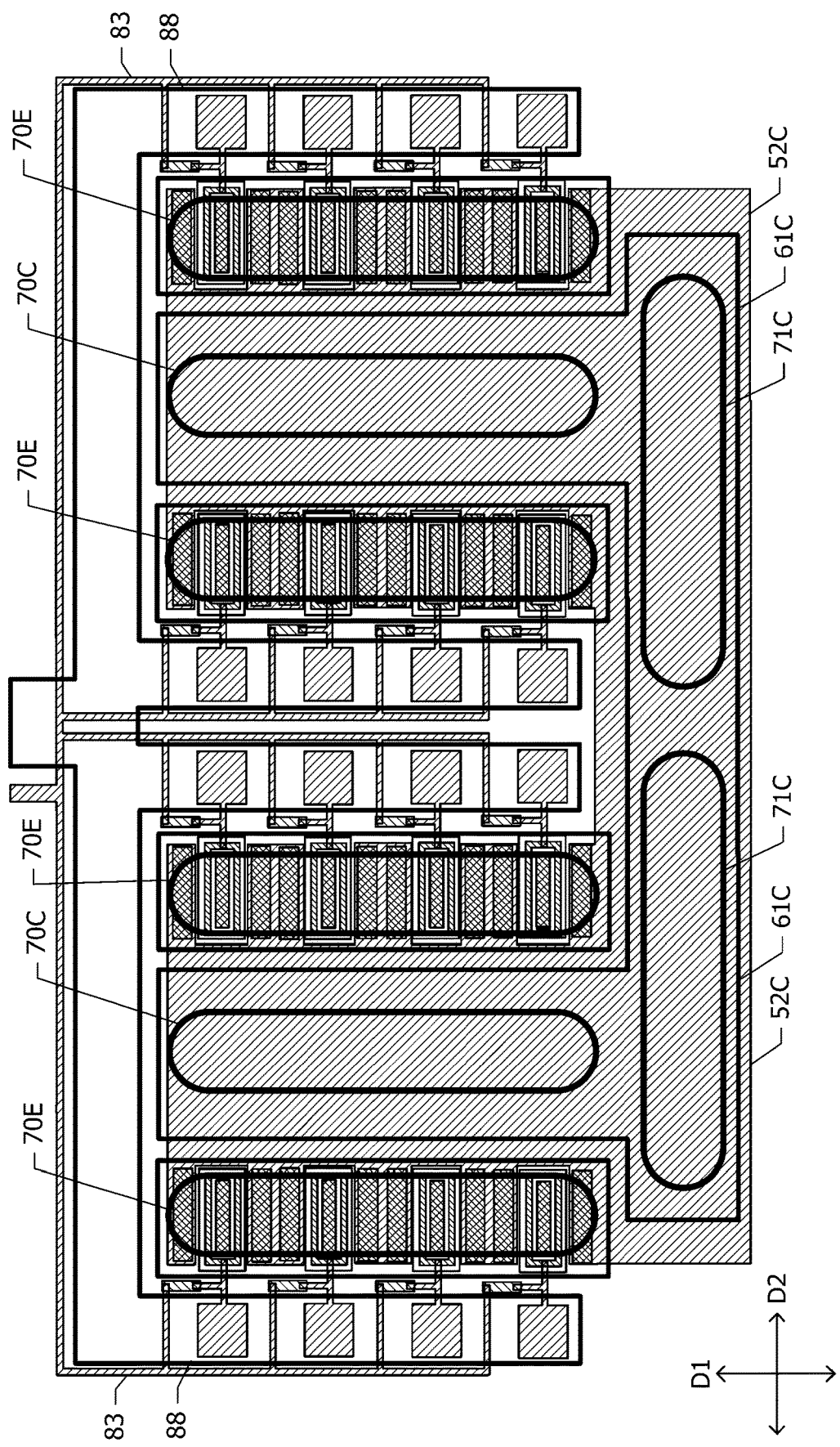
FIG. 9 is a view illustrating a positional relationship of a plurality of constituent elements of a semiconductor device according to a third embodiment when seen from above.

FIG. 9 is a view illustrating a positional relationship of a plurality of constituent elements of the semiconductor device according to the third embodiment when seen from above. In the third embodiment, two circuit configurations each having basically the same planar arrangement as the planar arrangement of the plurality of components in the semiconductor device (FIG. 8) according to the second embodiment are arranged side by side in the second direction D2. The collector wiring 52C of the first layer in one circuit configuration and the collector wiring 52C of the first layer in the other circuit configuration are continuous to each other. Similarly, the collector wiring 61C of the second layer in one circuit configuration and the collector wiring 61C of the second layer in the other circuit configuration are continuous to each other. The collector bumps 71C are individually arranged.

The bias input wiring 83 in one circuit configuration and the bias input wiring 83 in the other circuit configuration are continuous to each other, and the radio frequency signal input wiring 88 in one circuit configuration and the radio frequency signal input wiring 88 in the other circuit configuration are continuous to each other.

Next, an excellent effect of the third embodiment will be described.

Also in the third embodiment, similarly to the second embodiment, parasitic resistance and parasitic inductance in a path of a collector current can be reduced. As a result, it is possible to obtain an excellent effect that decrease in maximum output can be suppressed.

Fourth Embodiment

Next, a semiconductor device according to a fourth embodiment will be described with reference to FIG. 10. Hereinafter, description of configurations common to those of the semiconductor device (FIG. 8) according to the second embodiment will be omitted.

Figure 10:
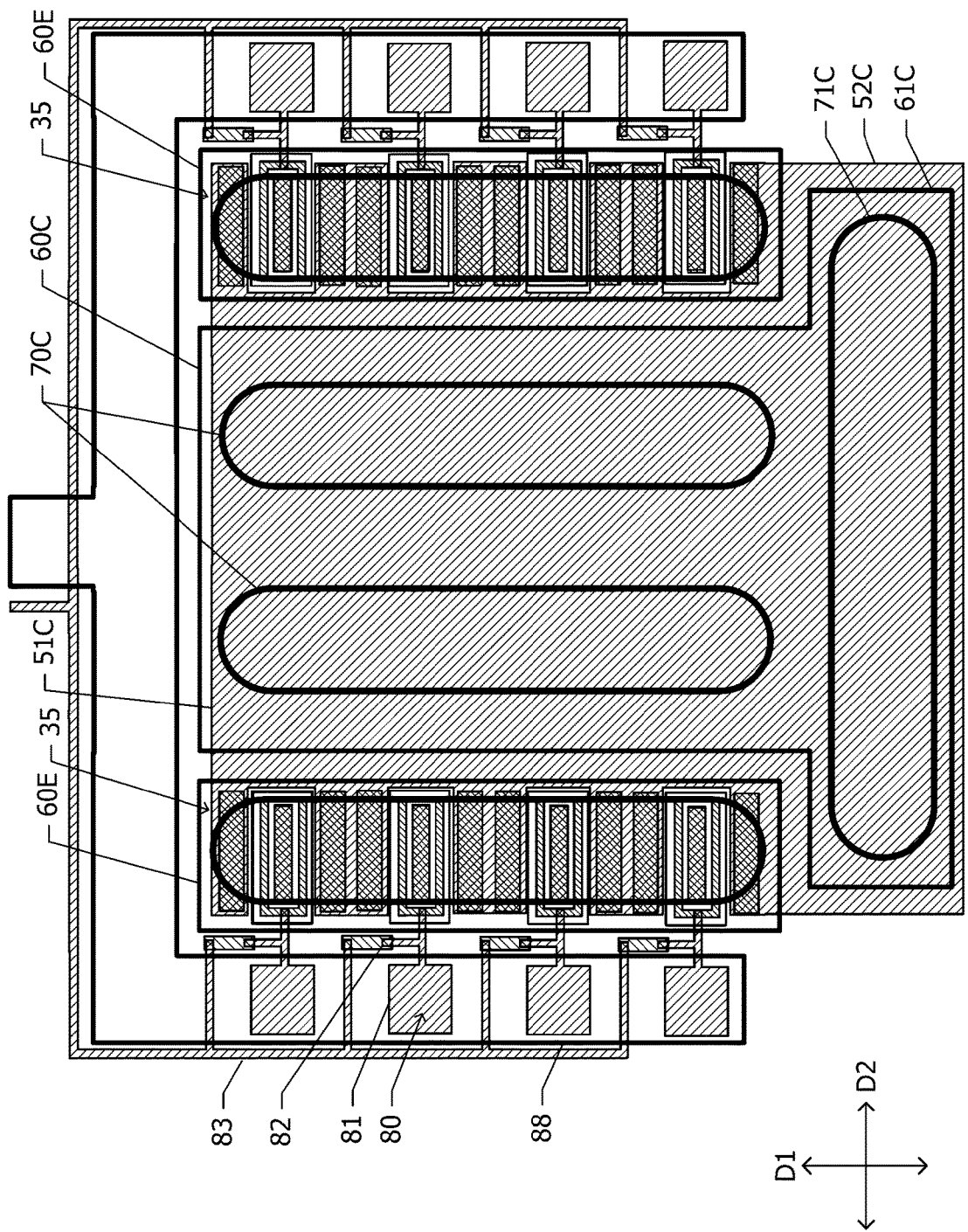
FIG. 10 is a view illustrating a positional relationship of a plurality of constituent elements of a semiconductor device according to a fourth embodiment when seen from above.

FIG. 10 is a view illustrating a positional relationship of a plurality of constituent elements of the semiconductor device according to the fourth embodiment when seen from above. In the second embodiment, one collector bump 70C (FIG. 8) is arranged between the two transistor rows 35. On the other hand, in the fourth embodiment, two collector bumps 70C are arranged in the region between the two transistor rows 35. The two collector bumps 70C have substantially elongated shapes in the first direction D1 when seen from above and are arranged at an interval in the second direction D2. In order to arrange the two collector bumps 70C in the region between the two transistor rows 35, the interval between the two transistor rows 35 in the second direction D2 is set to be wider than that in the first embodiment.

The two collector bumps 70C are connected to each other with the collector wiring 51C of the first layer and the collector wiring 60C of the second layer, which are arranged in the region between the two transistor rows 35, interposed therebetween. One collector bump 71C, which overlaps with the collector wiring 61C arranged in the outer side portion of the region between the two transistor rows 35, is arranged as in the case of the second embodiment.

Next, an excellent effect of the fourth embodiment will be described.

In the fourth embodiment, the two collector bumps 70C are arranged in the region between the two transistor rows 35. Therefore, the effect of reducing the parasitic resistance and the parasitic inductance of the path of the collector current is enhanced as compared with the case of the second embodiment (FIG. 8).

Subsequently, a variation of the fourth embodiment will be described. In the fourth embodiment, the two collector bumps 70C are arranged in the region between the two transistor rows 35 but equal to or more than three collector bumps 70C may be arranged.

Fifth Embodiment

Next, a semiconductor device according to a fifth embodiment will be described with reference to the drawings of FIGS. 11 to 13. Hereinafter, description of configurations common to those of the semiconductor device (FIGS. 1 to 4) according to the first embodiment will be omitted.

Figure 11:
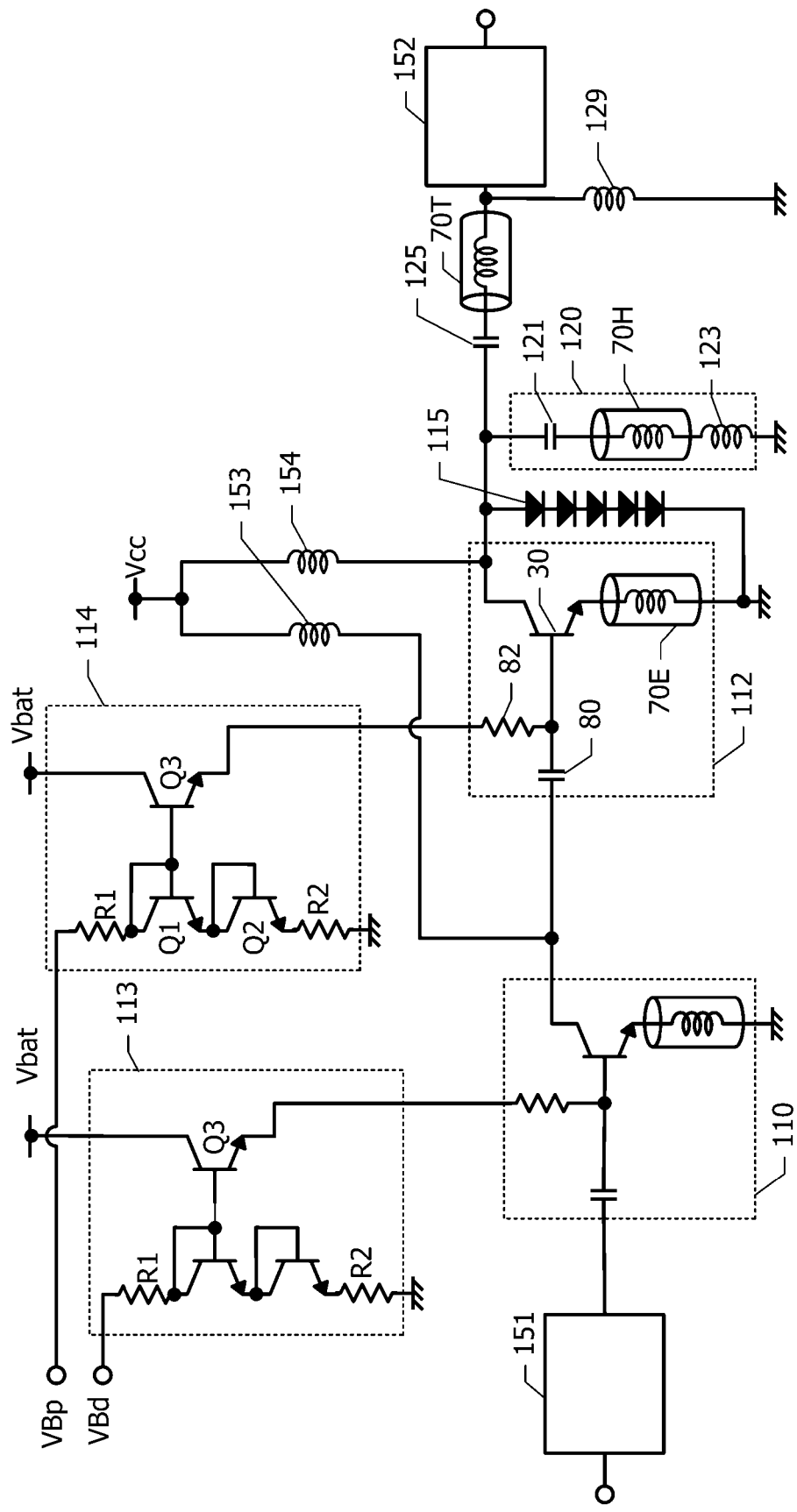
FIG. 11 is an equivalent circuit diagram of an amplification circuit module including a semiconductor device according to a fifth embodiment.

FIG. 11 is an equivalent circuit diagram of an amplification circuit module including the semiconductor device according to the fifth embodiment. The amplification circuit module according to the fifth embodiment includes the driver stage amplification circuit 110, the power stage amplification circuit 112, the driver stage bias circuit 113, the power stage bias circuit 114, the inductors 153 and 154, a protection circuit 115, a harmonic termination circuit 120, an output capacitor 125, an inductor 129, the input-side impedance matching circuit 151, and the output-side impedance matching circuit 152. In FIG. 11, inductors surrounded by columnar figures represent parasitic inductors of bumps.

The power stage amplification circuit 112 includes a plurality of unit cells each formed by the bipolar transistor 30, the input capacitor 80, and the resistor element 82. The plurality of unit cells is connected in parallel to each other. In FIG. 11, one of the plurality of unit cells is illustrated as a representative. The power supply voltage Vcc is applied to the collectors of the bipolar transistors 30 with the inductor 154 functioning as a choke coil interposed therebetween.

A bias current is supplied from the power stage bias circuit 114 to the bases of the bipolar transistors 30 with the resistor elements 82 interposed therebetween. The power stage bias circuit 114 includes the resistor element R1, the transistors Q1 and Q2, and the resistor element R2 connected in series between the bias control terminal VBp and the ground. Each of the transistors Q1 and Q2 is diode-connected and operates as a diode. The power stage bias circuit 114 further includes the emitter follower transistor Q3. The transistor Q1 and the emitter follower transistor Q3 constitute a current mirror. The bias voltage Vbat is applied to a collector of the emitter follower transistor Q3. An emitter of the emitter follower transistor Q3 is connected to the bases of the bipolar transistors 30 with the resistor elements 82 interposed therebetween. The power stage bias circuit 114 supplies, to the bipolar transistors 30, the bias current in accordance with a control voltage applied to the bias control terminal VBp.

The basic circuit configurations of the driver stage amplification circuit 110, the driver stage bias circuit 113, and the inductor 153 are the same as the circuit configurations of the power stage amplification circuit 112, the power stage bias circuit 114, and the inductor 154. However, the number of unit cells and the dimensions of the elements are different between the driver stage amplification circuit 110 and the power stage amplification circuit 112. In addition, the driver stage bias circuit 113 supplies a bias current in accordance with a control voltage applied to a bias control terminal VBd.

A radio frequency input signal is input to the driver stage amplification circuit 110 with the input-side impedance matching circuit 151 interposed therebetween. The radio frequency signal amplified by the driver stage amplification circuit 110 is input to the bases of the bipolar transistors 30 with the input capacitors 80 of the power stage amplification circuit 112 interposed therebetween. The emitters of the bipolar transistors 30 are grounded with the parasitic inductances of the emitter bumps 70E interposed therebetween.

The protection circuit 115 is inserted between the collectors of the bipolar transistors 30 of the power stage amplification circuit 112 and the ground. The protection circuit 115 is constituted by a plurality of diodes connected in series, and the diodes are connected in a direction in which a direction from the collectors toward the ground is a forward direction. When collector voltages of the bipolar transistors 30 exceed an allowable maximum value, the protection circuit 115 becomes conductive to protect the bipolar transistors 30.

The harmonic termination circuit 120 is further connected between the collectors of the bipolar transistors 30 of the power stage amplification circuit 112 and the ground. The harmonic termination circuit 120 is constituted of a series circuit of a harmonic termination capacitor 121, a parasitic inductance of a harmonic termination bump 70H, and a harmonic termination inductor 123.

The collectors of the bipolar transistors 30 of the power stage amplification circuit 112 are connected to the output-side impedance matching circuit 152 with the output capacitor 125 and a parasitic inductance of an output bump 70T (second bump) interposed therebetween. An interconnection point between the output bump 70T and the output-side impedance matching circuit 152 is grounded with the inductor 129 interposed therebetween.

Figure 12:
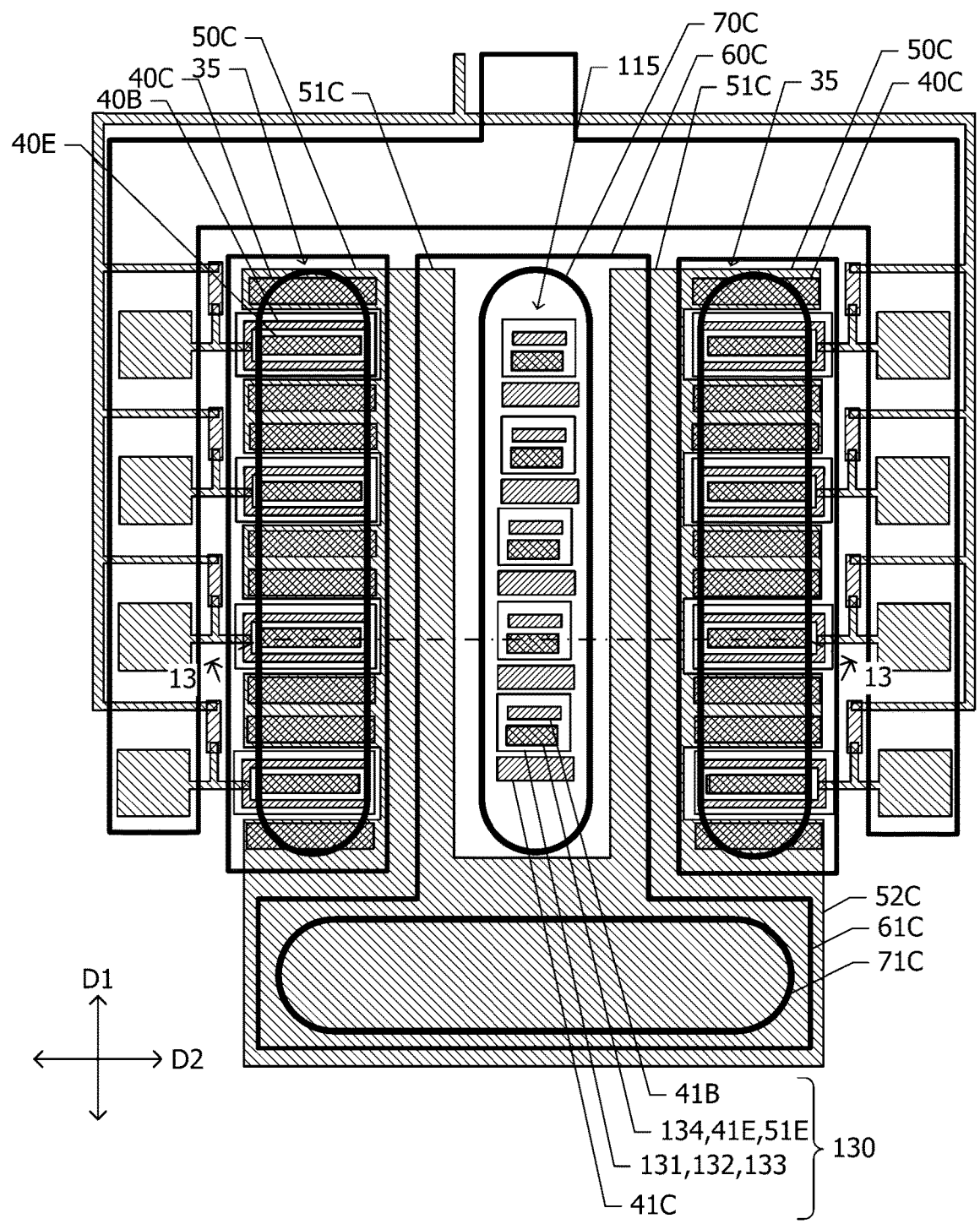
FIG. 12 is a view illustrating a positional relationship of a plurality of constituent elements of a power stage amplification circuit and peripheral circuits thereof in the semiconductor device according to the fifth embodiment when seen from above.

FIG. 12 is a view illustrating a positional relationship of a plurality of constituent elements of the power stage amplification circuit 112 (FIG. 11) and peripheral circuits thereof in the semiconductor device according to the fifth embodiment when seen from above. Hereinafter, description of the positional relationships common to the positional relationships of the plurality of constituent elements in the semiconductor device (FIG. 8) according to the second embodiment when seen from above will be omitted.

In the second embodiment, the collector wiring 51C of the first layer is arranged over or above substantially the entire region between the two transistor rows 35. On the other hand, in the fifth embodiment, two collector wirings 51C of the first layer are arranged so as to correspond to the two transistor rows 35. The two collector wirings 51C are connected to the plurality of collector extended wirings 50C connected to the collector electrodes 40C of the corresponding transistor rows 35. The two collector wirings 51C are connected to the collector wiring 52C at end portions thereof.

A plurality of transistors 130 constituting the protection circuit 115 (FIG. 11) is arranged in a region between the two collector wirings 51C. Each of the transistors 130 is diode-connected. Each of the transistors 130 includes a collector layer 131, a base layer 132, an emitter layer 133, an emitter mesa layer 134, a collector electrode 41C, a base electrode 41B, and an emitter electrode 41E. Emitter wirings 51E of the first layer are arranged so as to overlap the emitter electrodes 41E, respectively.

The shapes of the collector wirings 60C and 61C of the second layer when seen from above are the same as the shapes of the collector wirings 60C and 61C (FIG. 8) of the second layer in the second embodiment when seen from above. Therefore, the collector wiring 60C of the second layer overlaps with the plurality of transistors 130 when seen from above. The vicinities of the edges of the collector wiring 60C of the second layer arranged between the two transistor rows 35, which are parallel to the first direction D1, overlap with the collector wirings 51C of the first layer. In this overlapping portions, the collector wiring 60C of the second layer is connected to the collector wirings 51C of the first layer. Note that as in the case of the second embodiment (FIG. 8), the collector wiring 61C of the second layer is connected to the collector wiring 52C of the first layer.

Figure 13:
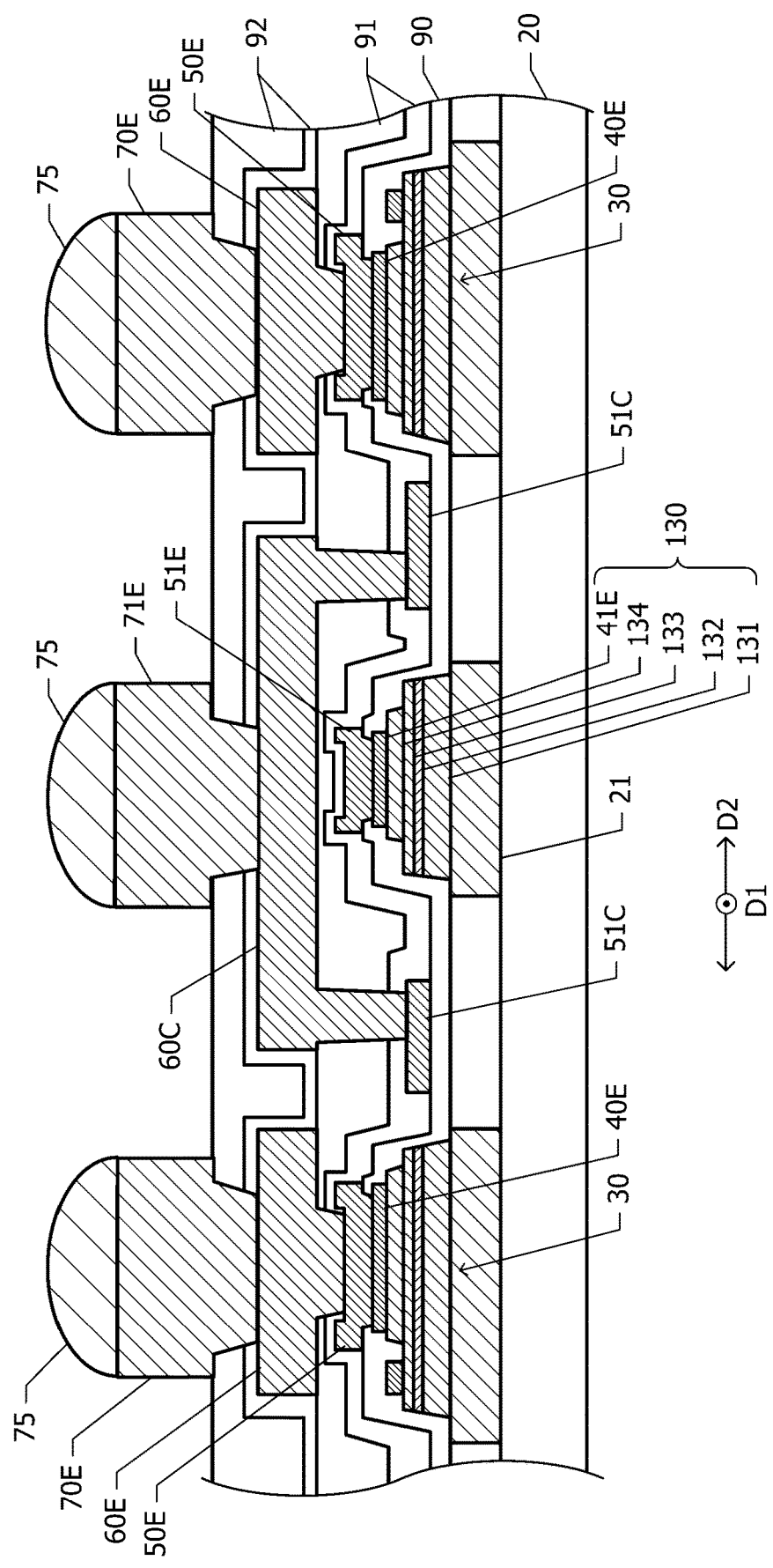
FIG. 13 is a cross-sectional view taken along a dashed-dotted line 13-13 in FIG. 12.

FIG. 13 is a cross-sectional view taken along a dashed-dotted line 13-13 in FIG. 12. Hereinafter, description of structures common to the cross-sectional structures (FIG. 2) of the semiconductor device according to the first embodiment will be omitted.

In the first embodiment, the collector wiring 51C (FIG. 2) of the first layer is arranged over or above substantially the entire region between the two bipolar transistor rows 35. On the other hand, in the fifth embodiment, the two collector wirings 51C of the first layer are arranged on the right and left sides. The transistors 130 are arranged between the two collector wirings 51C. The transistors 130 are encompassed in the sub-collector layer 21 when seen from above.

The collector layers 131, the base layers 132, and the emitter layers 133 are laminated in this order on the sub-collector layer 21. The outer circumferential lines of the collector layers 131, the base layers 132, and the emitter layers 133 substantially coincide with one another when seen from above. The emitter mesa layers 134 are arranged on or above partial regions of the upper surfaces of the emitter layers 133. The emitter electrodes 41E are arranged on or above the emitter mesa layers 134. The emitter wirings 51E of the first layer are arranged on or above the insulating film 90 covering the emitter electrodes 40E of the bipolar transistors 30 and the emitter electrodes 41E of the transistors 130. The emitter wirings 51E of the first layer are connected to the emitter electrodes 41E through cavities provided in the insulating film 90.

The collector wiring 60C of the second layer is arranged on or above the insulating film 91 covering the emitter wirings 51E and 50E of the first layer. The collector wiring 60C of the second layer is connected to the two collector wirings 51C of the first layer through cavities provided in the insulating film 91. The collector wiring 60C of the second layer overlaps with the transistors 130 when seen from above and is arranged above the transistors 130 with the insulating film 91 interposed therebetween.

The cross-sectional structure above the collector wiring 60C of the second layer and the emitter wirings 60E of the second layer is the same as the cross-sectional structure of the semiconductor device (FIG. 2) according to the first embodiment.

Next, an excellent effect of the fifth embodiment will be described.

Also in the fifth embodiment, similarly to the first embodiment, the collector bump 70C having a larger dimension in the thickness direction than the collector wirings 60C and 51C is arranged between the two transistor rows 35, and the shape thereof when seen from above is substantially elongated in the first direction. The collector bump 70C is connected to the collector land 201C (FIG. 3) having a large dimension in the second direction D2. Therefore, dimensions, in the thickness direction and the second direction D2, of a flow path of a collector current flowing in the first direction D1 are large. As a result, parasitic resistance and parasitic inductance in the path of the collector current are reduced. Accordingly, it is possible to suppress decrease in maximum output of the bipolar transistors 30.

Further, in the fifth embodiment, since the protection circuit 115 is arranged under the collector wiring 60C of the second layer, an area occupied by the entire amplification circuit in the substrate 20 can be reduced.

Subsequently, a semiconductor device according to a variation of the fifth embodiment will be described with reference to FIG. 14.

Figure 14:
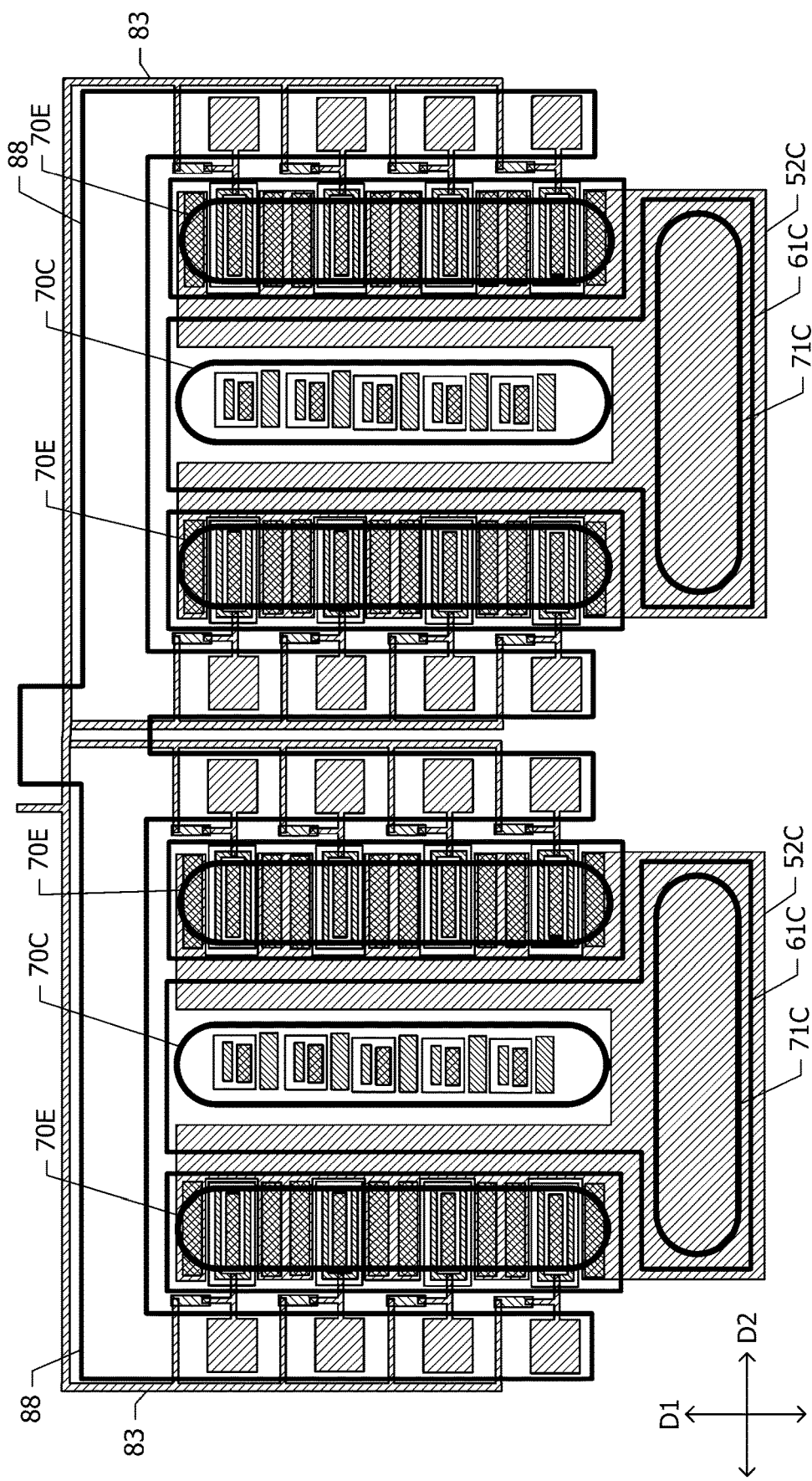
FIG. 14 is a view illustrating a positional relationship of a plurality of constituent elements of a power stage amplification circuit and peripheral circuits thereof in a semiconductor device according to a variation of the fifth embodiment when seen from above.

FIG. 14 is a view illustrating a positional relationship of a plurality of constituent elements of a power stage amplification circuit and peripheral circuits thereof in the semiconductor device according to the variation of the fifth embodiment when seen from above. In the variation, two circuit configurations each having substantially the same planar arrangement as the planar arrangement of the plurality of components in the semiconductor device (FIG. 12) according to the fifth embodiment are arranged in the second direction D2. The radio frequency signal input wiring 88 of one circuit configuration and the radio frequency signal input wiring 88 of the other circuit configuration are connected to each other. Further, the bias input wiring 83 of the other circuit configuration and the bias input wiring 83 of one circuit configuration are connected to each other. As described above, it is possible to achieve high output by arranging the plurality of semiconductor devices according to the fifth embodiment illustrated in FIG. 12 side by side.

Sixth Embodiment

Next, a semiconductor device according to a sixth embodiment will be described with reference to FIGS. 15 and 16. Hereinafter, description of configurations common to those of the semiconductor device (FIGS. 12 and 13) according to the fifth embodiment will be omitted.

Figure 15:
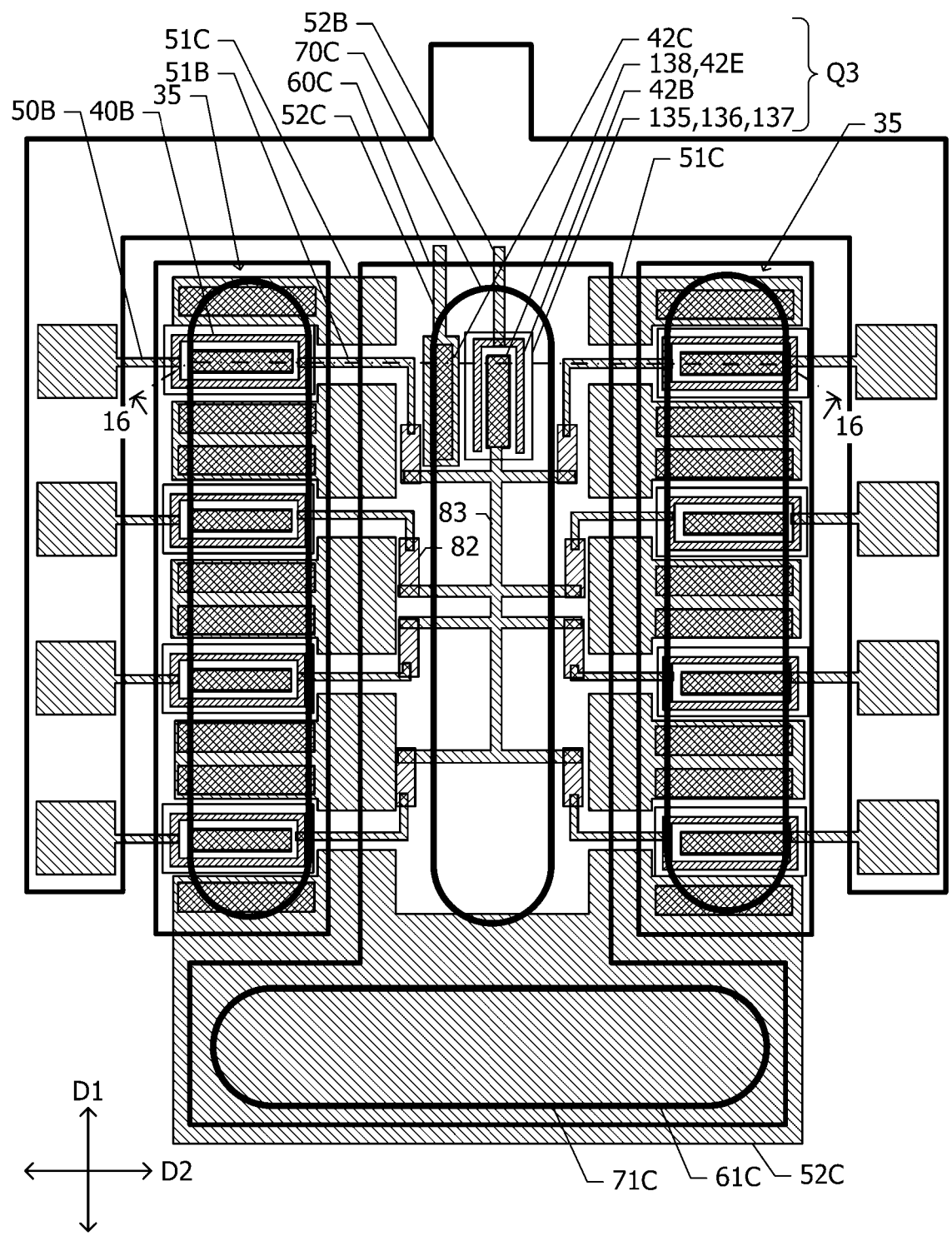
FIG. 15 is a view illustrating a positional relationship of a plurality of constituent elements of a power stage ampli

FIG. 15 is a view illustrating a positional relationship of a plurality of constituent elements of the power stage amplification circuit 112 (FIG. 11) and peripheral circuits thereof in the semiconductor device according to the sixth embodiment when seen from above. In the fifth embodiment, the protection circuit 115 (FIGS. 11 and 12) is arranged in the region between the two collector wirings 51C of the first layer. On the other hand, in the sixth embodiment, the plurality of resistor elements 82 and the emitter follower transistor Q3 (FIG. 11) of the power stage bias circuit 114 are arranged in the region between the two collector wirings 51C of the first layer.

In the sixth embodiment, the base electrodes 40B (FIG. 12) of the bipolar transistors 30 have the substantially U shapes when seen from above. On the other hand, in the sixth embodiment, the base electrodes 40B annularly surround four sides of the emitter electrodes 40E when seen from above. Base wirings 51B of the first layer are extended from the base electrodes 40B toward the region between the two transistor rows 35. The collector wirings 51C of the first layer are divided at places intersecting with the base wirings 51B of the first layer, and the collector wirings 51C are electrically insulated from the base wirings 51B. Note that the divided collector wirings 51C of the first layer are connected to each other with the collector wiring 60C of the second layer interposed therebetween.

The emitter follower transistor Q3 includes a collector layer 135, a base layer 136, an emitter layer 137, an emitter mesa layer 138, a collector electrode 42C, a base electrode 42B, and an emitter electrode 42E. The plurality of base wirings 51B of the first layer is connected to one ends of the corresponding resistor elements 82, respectively. The other ends of the plurality of resistor elements 82 are connected to the emitter electrode 42E of the emitter follower transistor Q3 with the bias input wiring 83 interposed therebetween.

The collector wiring 52C of the first layer is connected to the collector electrode 42C, and a base wiring 52B of the first layer is connected to the base electrode 42B. The bias voltage Vbat (FIG. 11) is applied to the collector electrode 42C with the collector wiring 52C interposed therebetween. The base wiring 52B is connected to the base of the transistor Q1 (FIG. 11) of the power stage bias circuit 114.

Figure 16:
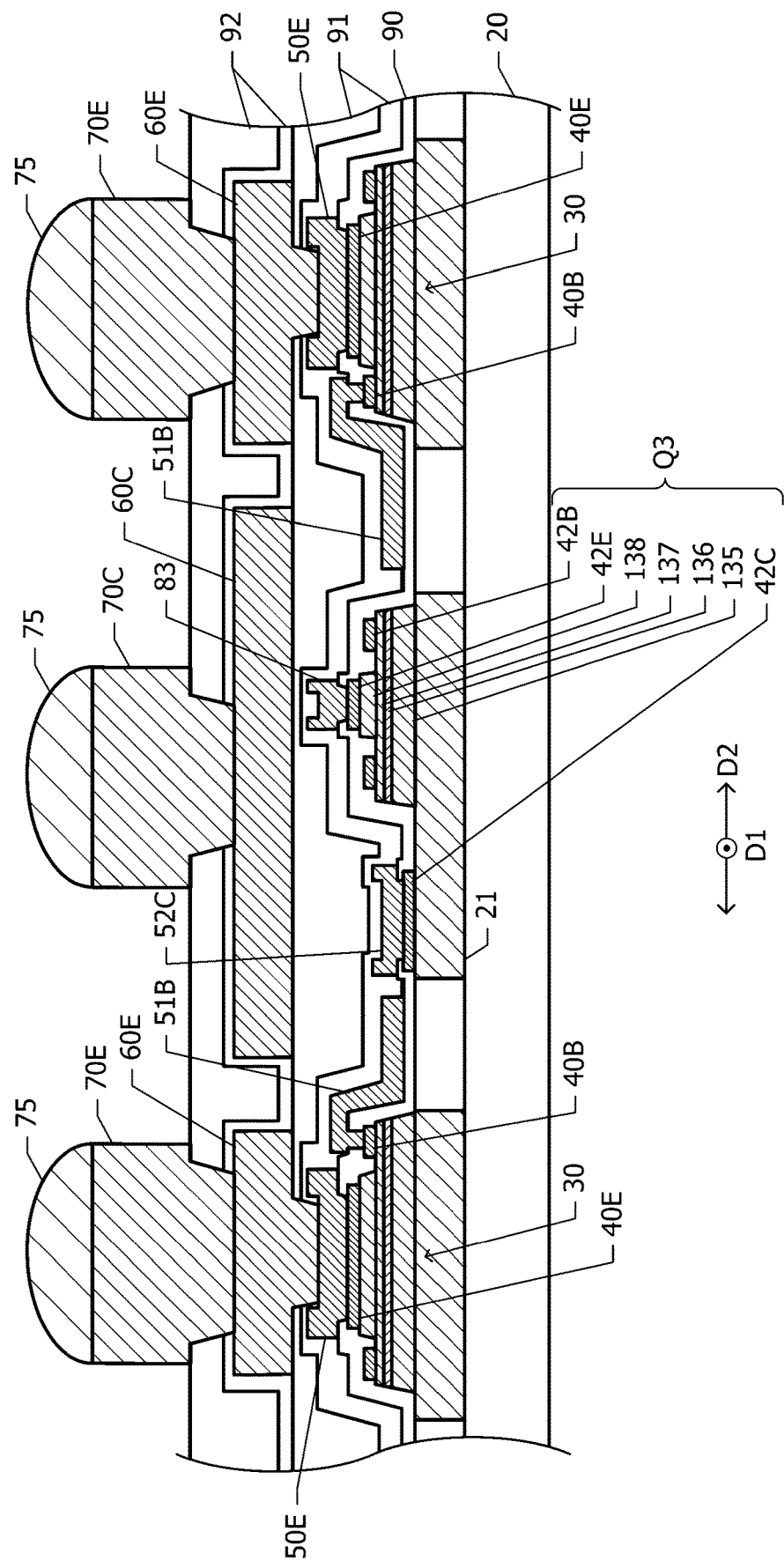
- FIG. 16 is a cross-sectional view taken along a dashed-dotted line 16-16 in FIG. 15.

FIG. 16 is a cross-sectional view taken along a dashed-dotted line 16-16 in FIG. 15. Hereinafter, description of structures common to the cross-sectional structures (FIG. 13) of the semiconductor device according to the fifth embodiment will be omitted. In the fifth embodiment, the transistors 130 (FIG. 13) are arranged between the two bipolar transistor rows 35. However, in the sixth embodiment, the emitter follower transistor Q3 is arranged between the two bipolar transistor rows 35.

The emitter follower transistor Q3 is encompassed in the sub-collector layer 21 when seen from above. On the sub-collector layer 21, the collector layer 135, the base layer 136, and the emitter layer 137 are arranged. Further, the collector electrode 42C is arranged in a region of the upper surface of the sub-collector layer 21 in which the collector layer 135 is not arranged. The collector electrode 42C is electrically connected to the collector layer 135 with the sub-collector layer 21 interposed therebetween. The emitter mesa layer 138 and the base electrode 42B are arranged on or above the emitter layer 137. The base electrode 42B is electrically connected to the base layer 136 with an alloying region, which penetrates through the emitter layer 137 in the thickness direction, interposed therebetween. The emitter electrode 42E is arranged on or above the emitter mesa layer 138. The emitter electrode 42E is electrically connected to the emitter layer 137 with the emitter mesa layer 138 interposed therebetween.

The emitter electrodes 40E of the bipolar transistors 30 and the emitter electrode 42E, the base electrode 42B, and the collector electrode 42C of the emitter follower transistor Q3 are covered by the insulating film 90. On the insulating film 90, the base wirings 51B of the first layer, the bias input wiring 83, and the emitter wirings 50E of the first wiring are arranged. The base wirings 51B are connected to the base electrodes 40B through cavities provided in the insulating film 90. The base wirings 51B extend from connection places with the base electrodes 40B toward the region between the two transistor rows 35. The bias input wiring 83 is connected to the emitter electrode 42E of the emitter follower transistor Q3 through a cavity provided in the insulating film 90.

The emitter wirings 50E of the first layer and the bias input wiring 83 are covered by the insulating film 91. The structure above the insulating film 91 is the same as the structure of the semiconductor device (FIG. 13) according to the fifth embodiment. Note that the collector wiring 60C of the second layer is connected to the collector wirings 51C of the first layer with the same structure as the connection structure illustrated in FIG. 13 in portions other than the cross section illustrated in FIG. 16.

Next, an excellent effect of the sixth embodiment will be described.

Also in the sixth embodiment, similarly to the first embodiment, the collector bump 70C having a larger dimension in the thickness direction than the collector wirings 60C and 51C is arranged between the two transistor rows 35, and the shape thereof when seen from above is substantially elongated in the first direction. The collector bump 70C is connected to the collector land 201C (FIG. 3) having a large dimension in the second direction D2. Therefore, dimensions, in the thickness direction and the second direction D2, of a flow path of a collector current flowing in the first direction D1 are large. As a result, parasitic resistance and parasitic inductance in the path of the collector current are reduced. Accordingly, it is possible to suppress decrease in maximum output of the bipolar transistors 30.

Further, in the sixth embodiment, since the emitter follower transistor Q3 of the power stage bias circuit 114 (FIG. 11) and the resistor elements 82 are arranged under the collector wiring 60C of the second layer, an area occupied by the entire amplification circuit in the substrate 20 can be reduced.

Seventh Embodiment

Next, a semiconductor device according to a seventh embodiment will be described with reference to FIGS. 17, 18, and 19. Hereinafter, description of configurations common to those of the semiconductor device (FIGS. 1 to 4) according to the first embodiment will be omitted. Note that an amplification circuit module using the semiconductor device according to the seventh embodiment is also represented by the equivalent circuit diagram illustrated in FIG. 11, similarly to the amplification circuit module according to the fifth embodiment.

Figure 17:
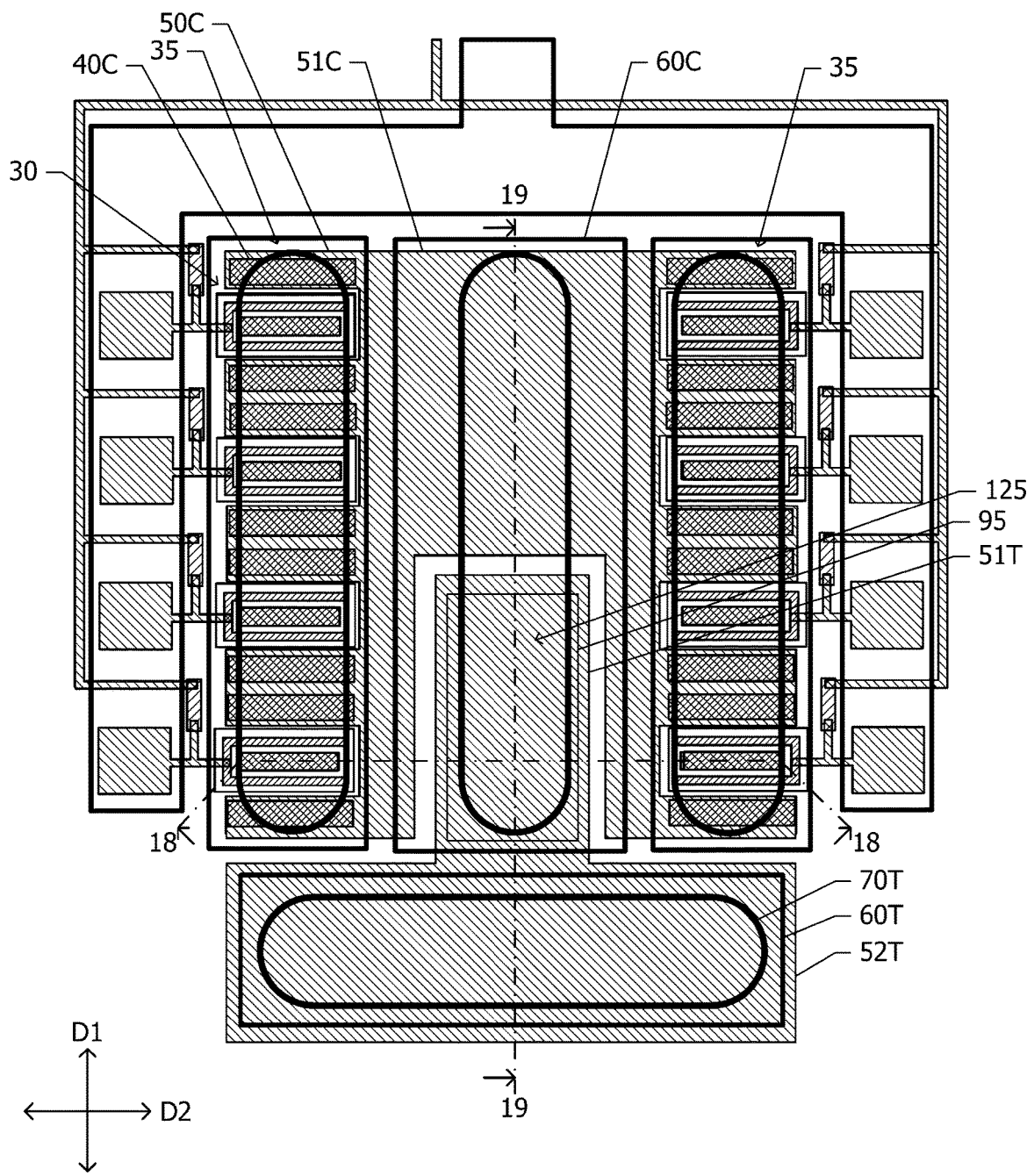
FIG. 17 is a view illustrating a positional relationship of a plurality of constituent elements of a power stage amplification circuit and peripheral circuits thereof in a semiconductor device according to a seventh embodiment when seen from above.

FIG. 17 is a view illustrating a positional relationship of a plurality of constituent elements of the power stage amplification circuit 112 (FIG. 11) and peripheral circuits thereof in the semiconductor device according to the seventh embodiment when seen from above. In the first embodiment, the collector wiring 51C (FIG. 1) of the first layer is arranged in or above substantially the entire region between the two transistor rows 35. On the other hand, in the seventh embodiment, the collector wiring 51C is removed in a part of the region between the two transistor rows 35, and instead, an output wiring 51T (second wiring) is arranged. An output wiring 52T (second wiring) is arranged also in an outer side portion of the region between the two transistor rows 35, and the output wiring 51T is continuous to the output wiring 52T. The output wiring 52T arranged in the outer side portion of the region between the two transistor rows 35 has a substantially elongated shape in the second direction D2 when seen from above.

The collector wiring 60C of the second layer arranged in the region between the two transistor rows 35 overlaps with both of the collector wiring 51C of the first layer and the output wiring 51T of the first layer when seen from above. The collector wiring 60C of the second layer is connected to the collector wiring 51C of the first layer. Here, the expression "connected" means "galvanically connected". Note that the expression "connected" in the specification means "galvanically connected" unless otherwise specified. A capacitor dielectric film 95 is arranged between the collector wiring 60C of the second layer and the output wiring 51T of the first layer. The output capacitor 125 (FIG. 11) is constituted by the collector wiring 60C of the second layer and the output wiring 51T of the first layer that face each other on the upper and lower sides of the capacitor dielectric film 95.

An output wiring 60T of the second layer is arranged so as to overlap with the output wiring 52T of the first layer when seen from above. Further, the output bump 70T is arranged so as to overlap with the output wiring 60T of the second layer when seen from above. The output bump 70T (FIG. 11) is connected to the output wiring 51T functioning as a lower electrode of the output capacitor 125 with the output wiring 60T of the second layer and the output wiring 52T of the first layer interposed therebetween.

Figure 18:
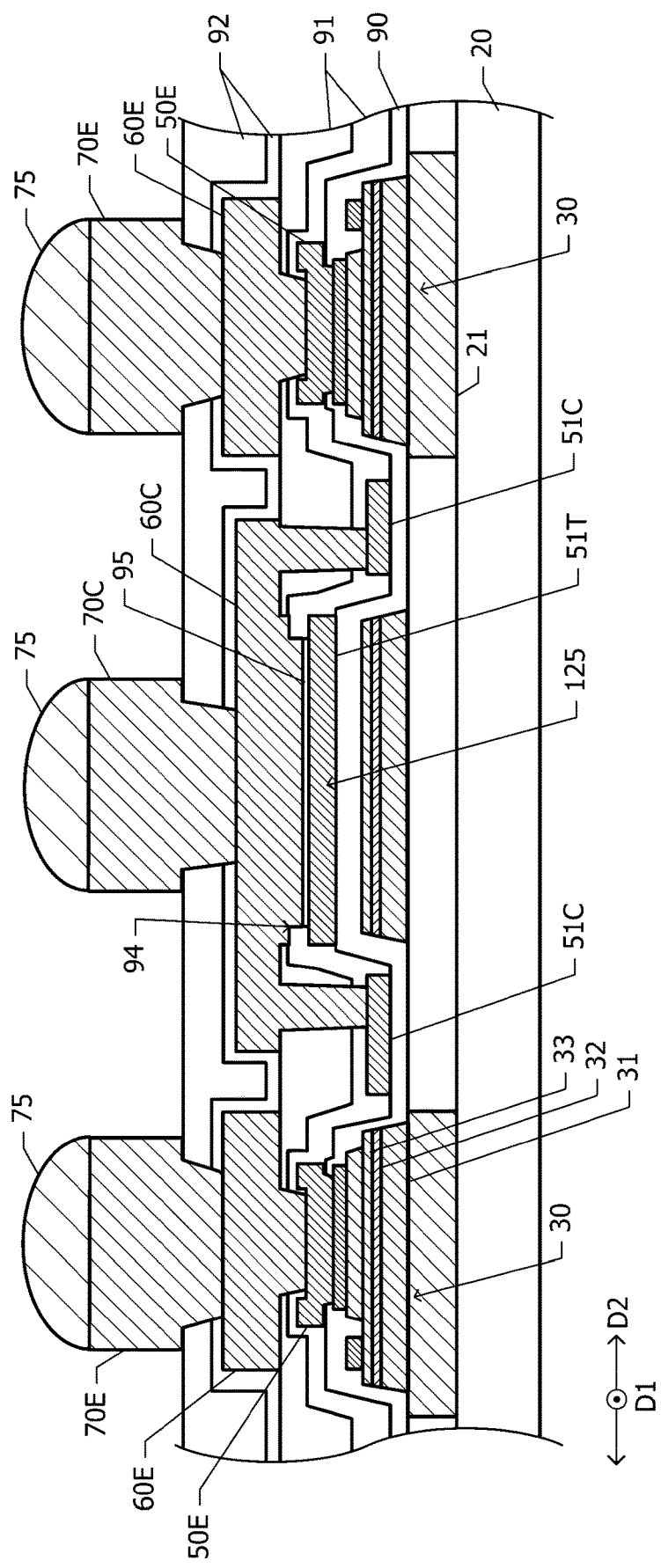
FIG. 18 is a cross-sectional view taken along a dashed-dotted line 18-18 in FIG. 17.

FIG. 18 is a cross-sectional view taken along a dashed-dotted line 18-18 in FIG. 17. Hereinafter, description of structures common to the cross-sectional structures (FIG. 2) of the semiconductor device according to the first embodiment will be omitted. In the first embodiment, the collector wiring 51C of the first layer is arranged in or above substantially the entire region between the two bipolar transistors 30. On the other hand, in the seventh embodiment, in the cross section illustrated in FIG. 18, the collector wiring 51C of the first layer is divided into two portions. The output wiring 51T of the first layer is arranged between the two portions of the collector wiring 51C. Note that in a region overlapping with the output wiring 51T when seen from above, semiconductor layers formed by the same processes as those of the collector layers 31, the base layers 32, and the emitter layers 33 of the bipolar transistors 30 are left.

The collector wiring 51C, the output wiring 51T, and the emitter wirings 50E of the first layer are covered by the insulating film 91. A cavity 94 reaching the bottom surface from the upper surface of the insulating film 91 is provided in a region overlapping with the output wiring 51T when seen from above. The capacitor dielectric film 95 is arranged on or above the surface of the output wiring 51T located inside the cavity 94 when seen from above.

The collector wiring 60C of the second layer is arranged on or above the insulating film 91 and the capacitor dielectric film 95. The output capacitor 125 is constituted by the collector wiring 60C and the output wiring 50T that face each other in the up-down direction with the capacitor dielectric film 95 interposed therebetween. The collector wiring 60C is connected to the collector wiring 51C of the first layer through the cavity provided in the insulating film 91 on both sides of the output wiring 50T. Further, the emitter wirings 60E of the second layer are arranged on or above the insulating film 91. The emitter wirings 60E of the second layer are connected to the emitter wirings 50E of the first layer through cavities provided in the insulating film 91.

The structure above the collector wiring 60C and the emitter wirings 60E of the second layer is the same as the structure of the semiconductor device (FIG. 2) according to the first embodiment.

Figure 19:
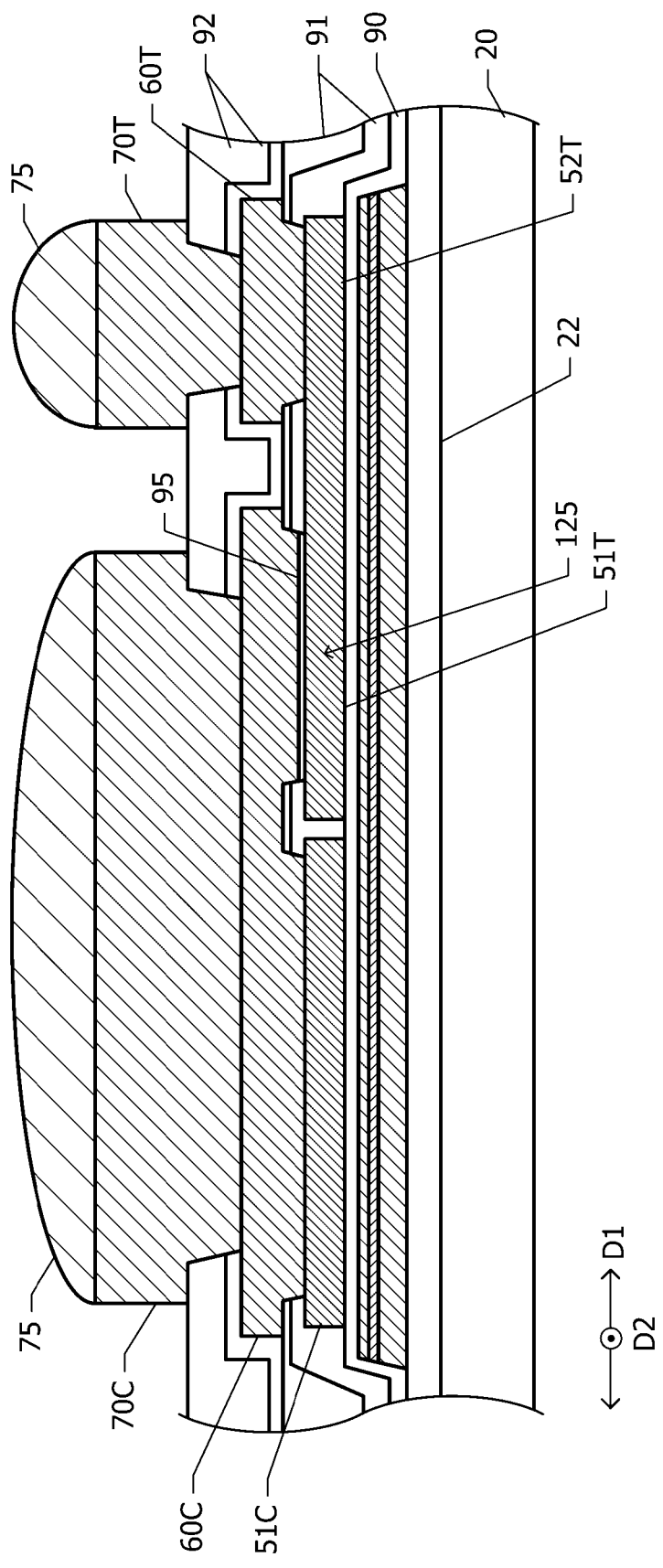
FIG. 19 is a cross-sectional view taken along a dashed-dotted line 19-19 in FIG. 17.

FIG. 19 is a cross-sectional view taken along a dashed-dotted line 19-19 in FIG. 17. On the element isolation region 22, semiconductor layers formed by the same processes as those of the collector layers 31, the base layers 32, and the emitter layers 33 (FIG. 18) of the bipolar transistors 30 are left. The insulating film 90 is arranged on or above the semiconductor layers and the element isolation region 22. The collector wiring 51C and the output wirings 51T and 52T of the first layer are arranged on or above the insulating film 90. The collector wiring 51C and the output wirings 51T and 52T are covered by the insulating film 91.

The collector wiring 60C and the output wiring 60T of the second layer are arranged on or above the insulating film 91. The collector wiring 60C of the second layer is connected to the collector wiring 51C of the first layer through the cavity provided in the insulating film 91. Further, the collector wiring 60C of the second layer faces the output wiring 51T of the first layer with the capacitor dielectric film 95 arranged in the cavity of the insulating film 91 interposed therebetween. The output capacitor 125 is constituted by the collector wiring 60C of the second layer and the output wiring 51T of the first layer that face each other in the up-down direction with the capacitor dielectric film 95 interposed therebetween.

The output wiring 60T of the second layer is connected to the output wiring 52T of the first layer through the cavity provided in the insulating film 91. The insulating film 92 is arranged so as to cover the collector wiring 60C and the output wiring 61T of the second layer. On the insulating film 91, the collector bump 70C and the output bump 70T are arranged. The collector bump 70C is connected to the collector wiring 60C of the second layer through the cavity provided in the insulating film 92. The output bump 70T is connected to the output wiring 60T of the second layer through the cavity provided in the insulating film 92. The solder layer 75 is arranged on each of the collector bump 70C and the output bump 70T.

The collector electrodes 40C (FIG. 17) of the bipolar transistors 30 (FIG. 17 and FIG. 18) are connected to the output bump 70T in a high frequency manner with the collector extended wirings 50C (FIG. 17), the collector wiring 51C of the first layer, the collector wiring 60C of the second layer, the output capacitor 125, the output wirings 51T and 52T of the first layer, and the output wiring 60T of the second layer interposed therebetween.

Next, an excellent effect of the seventh embodiment will be described.

Also in the seventh embodiment, the collector bump 70C is arranged in the region between the two transistor rows 35. In FIGS. 18 and 19, since the power supply voltage Vcc (FIG. 11) is supplied from the upper surfaces of the collector land 201C (FIG. 3) and the collector bump 70C, a direct-current (DC) component of the collector current has almost no component flowing in the first direction as in the case of the first embodiment. Therefore, it is possible to reduce parasitic resistance and parasitic inductance for the DC component of the collector current.

In FIG. 19, an alternating-current (AC) component of the collector current passes through the output bump 70T, the output wiring 60T of the second layer, the output wiring 51T of the first layer, the output capacitor 125, the collector wiring 60C of the second layer, and the collector wiring 51C of the first layer. The collector land 201C (FIG. 3) having large dimensions in the thickness direction and the second direction D2 and the collector bump 70C having a large dimension in the thickness direction are connected in parallel to a path in which the AC component of the collector current flows through the collector wiring 60C of the second layer in the first direction D1. Therefore, the cross-section of the path of the AC component of the collector current is large. As a result, increase in parasitic resistance and parasitic inductance can be suppressed also for the AC component of the collector current. Accordingly, it is possible to suppress decrease in maximum output of the bipolar transistors 30.

Further, in the seventh embodiment, since the output capacitor 125 is incorporated in the semiconductor chip, it is not necessary to mount, on the mounting substrate, an individual circuit component that operates as the output capacitor 125. In addition, the output capacitor 125 overlaps with the collector bump 70C when seen from above, thereby suppressing increase in the size of the semiconductor chip.

Eighth Embodiment

Next, a semiconductor device according to an eighth embodiment will be described with reference to FIG. 20. Hereinafter, description of configurations common to those of the semiconductor device (FIGS. 17 to 19) according to the seventh embodiment will be omitted.

Figure 20:
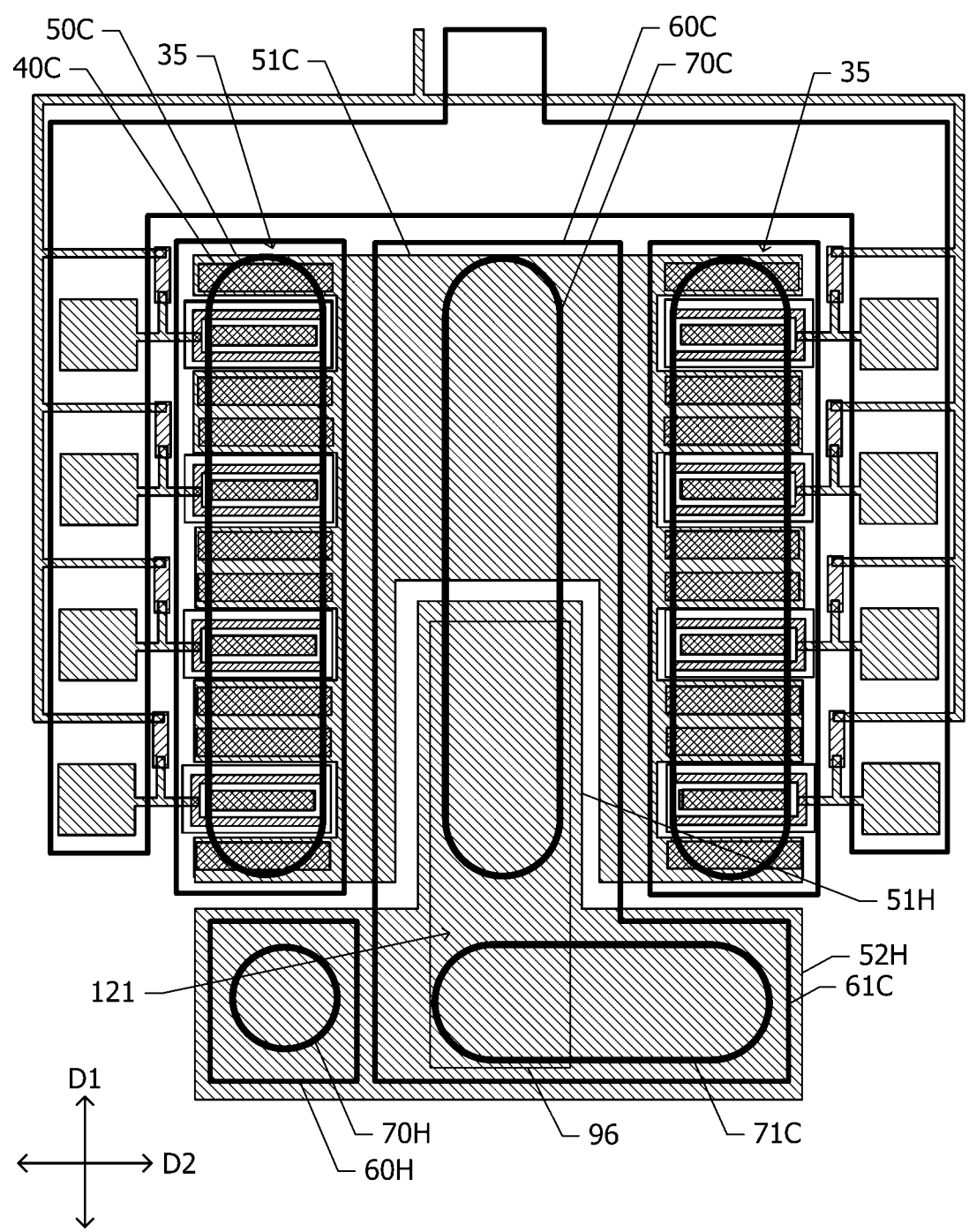
FIG. 20 is a view illustrating a positional relationship of a plurality of constituent elements of a power stage amplification circuit and peripheral circuits thereof in a semiconductor device according to an eighth embodiment when seen from above.

FIG. 20 is a view illustrating a positional relationship of a plurality of constituent elements of the power stage amplification circuit 112 (FIG. 11) and peripheral circuits thereof in the semiconductor device according to the eighth embodiment when seen from above. In the eighth embodiment, instead of the output wirings 51T and 52T (FIG. 17) of the first layer in the semiconductor device according to the seventh embodiment, harmonic termination wirings 51H and 52H (third wiring) of the first layer, which have the same shapes as them when seen from above, are arranged. The harmonic termination wiring 51H is arranged in the region between the two transistor rows 35, and the harmonic termination wiring 52H continuous thereto is arranged in an outer side portion of the region between the two transistor rows 35.

The collector wiring 61C of the second layer is arranged so as to overlap with the harmonic termination wiring 52H when seen from above. The collector wiring 61C is continuous to the collector wiring 60C of the second layer arranged in the region between the two transistor rows 35. Further, a harmonic termination wiring 60H of the second layer is arranged so as to overlap with the harmonic termination wiring 52H.

The collector wiring 60C of the second layer is galvanically connected to the collector wiring 51C of the first layer. The collector wiring 60C of the second layer is connected to the harmonic termination wirings 51H and 52H of the first layer in a high frequency manner with a harmonic termination capacitor 121 (second capacitor) including the capacitor dielectric film 96 interposed therebetween. The harmonic termination wiring 60H of the second wiring is galvanically connected to the harmonic termination wiring 52H of the first layer.

The collector bumps 70C and 71C are arranged so as to overlap with the collector wirings 60C and 61C of the second layer, respectively, when seen from above. The collector bump 70C has a substantially elongated shape in the first direction D1 when seen from above. The collector bumps 70C and 71C are connected to the collector wirings 60C and 61C of the second layer, respectively. A harmonic termination bump 70H (third bump) is arranged so as to overlap with the harmonic termination wiring 60H of the second layer. The harmonic termination bump 70H is connected to the harmonic termination wiring 60H of the second layer.

The collector electrodes 40C of the bipolar transistors 30 are connected to the collector bumps 70C and 71C with the collector extended wirings 50C of the first layer, the collector wiring 51C, and the collector wirings 60C and 61C of the second layer interposed therebetween. Further, the collector electrodes 40C are connected to the harmonic termination bump 70H in a high frequency manner with the collector extended wiring 50C of the first layer, and the collector wiring 51C, the collector wirings 60C and 61C of the second wiring, the harmonic termination capacitor 121, the harmonic termination wirings 51H and 52H of the first layer, and the harmonic termination wiring 60H of the second layer interposed therebetween.

The harmonic termination capacitor 121 and the harmonic termination bump 70H correspond to the harmonic termination capacitor 121 and the harmonic termination bump 70H illustrated in FIG. 11, respectively. The power supply voltage Vcc is applied to the collector bumps 70C and 71C with the inductor 154 (FIG. 11) interposed therebetween. Further, the radio frequency signals output from the collector bumps 70C and 71C are output to the external device with the output capacitor 125 and the output-side impedance matching circuit 152 (FIG. 11) mounted on the mounting substrate interposed therebetween.

Next, an excellent effect of the eighth embodiment will be described. Also in the eighth embodiment, the collector bump 70C having a large dimension in the thickness direction is arranged in the region between the two transistor rows 35 and is connected to the collector land 201C (FIG. 3) having large dimensions in the thickness direction and the second direction D2. Therefore, dimensions, in the thickness direction and the second direction D2, of a flow path of a collector current flowing in the first direction D1 are large. As a result, parasitic resistance and parasitic inductance in the path of the collector current can be reduced as in the case of the first embodiment. As a result, it is possible to obtain an excellent effect that decrease in maximum output of the bipolar transistors 30 is suppressed.

Further, in the eighth embodiment, since the harmonic termination capacitor 121 is incorporated in the semiconductor chip, it is not necessary to mount, on the mounting substrate, the harmonic termination capacitor 121 as an individual circuit component. In addition, the harmonic termination capacitor 121 is arranged so as to overlap with the collector wirings 60C and 61C when seen from above, thereby suppressing increase in the size of the semiconductor chip.

Ninth Embodiment

Next, an amplification circuit module in which a semiconductor device according to a ninth embodiment is mounted will be described with reference to FIGS. 21 and 22. Hereinafter, description of configurations common to those of the semiconductor device according to the second embodiment (FIG. 8) will be omitted.

Figure 21:
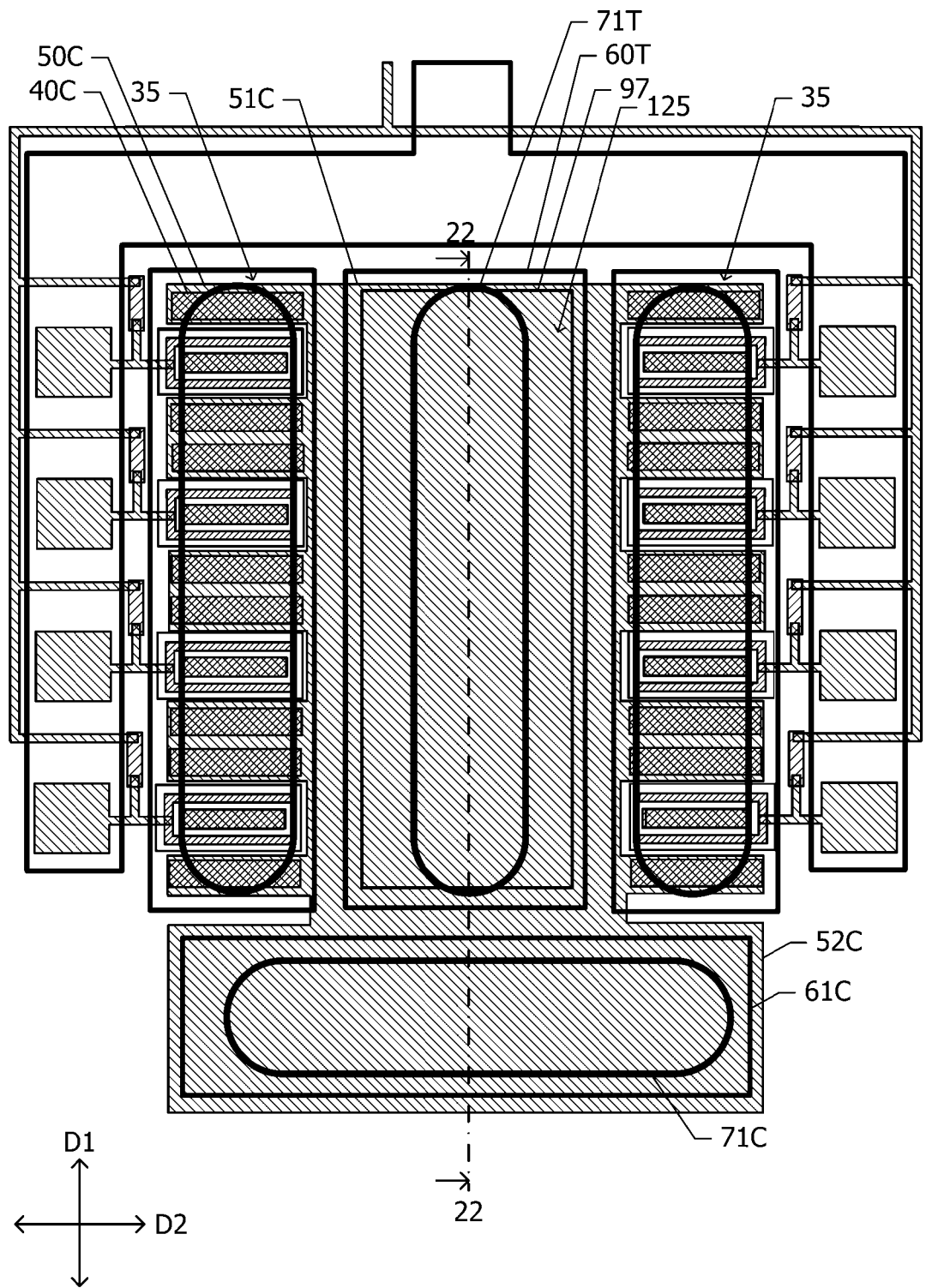
FIG. 21 is a view illustrating a positional relationship of a plurality of constituent elements of a power stage amplification circuit and peripheral circuits thereof in a semiconductor device according to a ninth embodiment when seen from above.

FIG. 21 is a view illustrating a positional relationship of a plurality of constituent elements of the power stage amplification circuit 112 (FIG. 11) and peripheral circuits thereof in the semiconductor device according to the ninth embodiment when seen from above. In the second embodiment, the collector wiring 60C (FIG. 8) of the second layer arranged in the region between the two transistor rows 35 is continuous to the collector wiring 61C (FIG. 8) of the second layer arranged in the outer side portion of this region. On the other hand, in the ninth embodiment, the output wiring 60T of the second layer is arranged instead of the collector wiring 60C in the region between the two transistor rows 35. The output wiring 60T is within the region between the two transistor rows 35. The collector wiring 61C of the second layer is arranged at a position overlapping with the collector wiring 52C of the first layer when seen from above.

The capacitor dielectric film 97 is arranged between the collector wiring 51C of the first layer and the output wiring 60T of the second layer. The output capacitor 125 (first capacitor) is constituted by the collector wiring 51C of the first layer and the output wiring 60T of the second layer that face each other with the capacitor dielectric film 97 interposed therebetween. The collector wiring 61C of the second layer is galvanically connected to the collector wiring 52C of the first layer.

The collector bump 71C is arranged so as to overlap with the collector wiring 61C of the second layer when seen from above. The collector bump 71C is galvanically connected to the collector electrodes 40C of the bipolar transistors 30 with the collector wiring 61C of the second layer, the collector wirings 52C and 51C of the first layer, and the collector extended wirings 50C interposed therebetween.

The output bump 71T (fourth bump) is arranged so as to overlap with the output wiring 60T of the second layer when seen from above. The output bump 71T is connected to the collector electrodes 40C of the bipolar transistors 30 in a high frequency manner with the output wiring 60T of the second layer, the output capacitor 125, the collector wiring 51C of the first layer, and the collector extended wirings 50C interposed therebetween.

Figure 22:
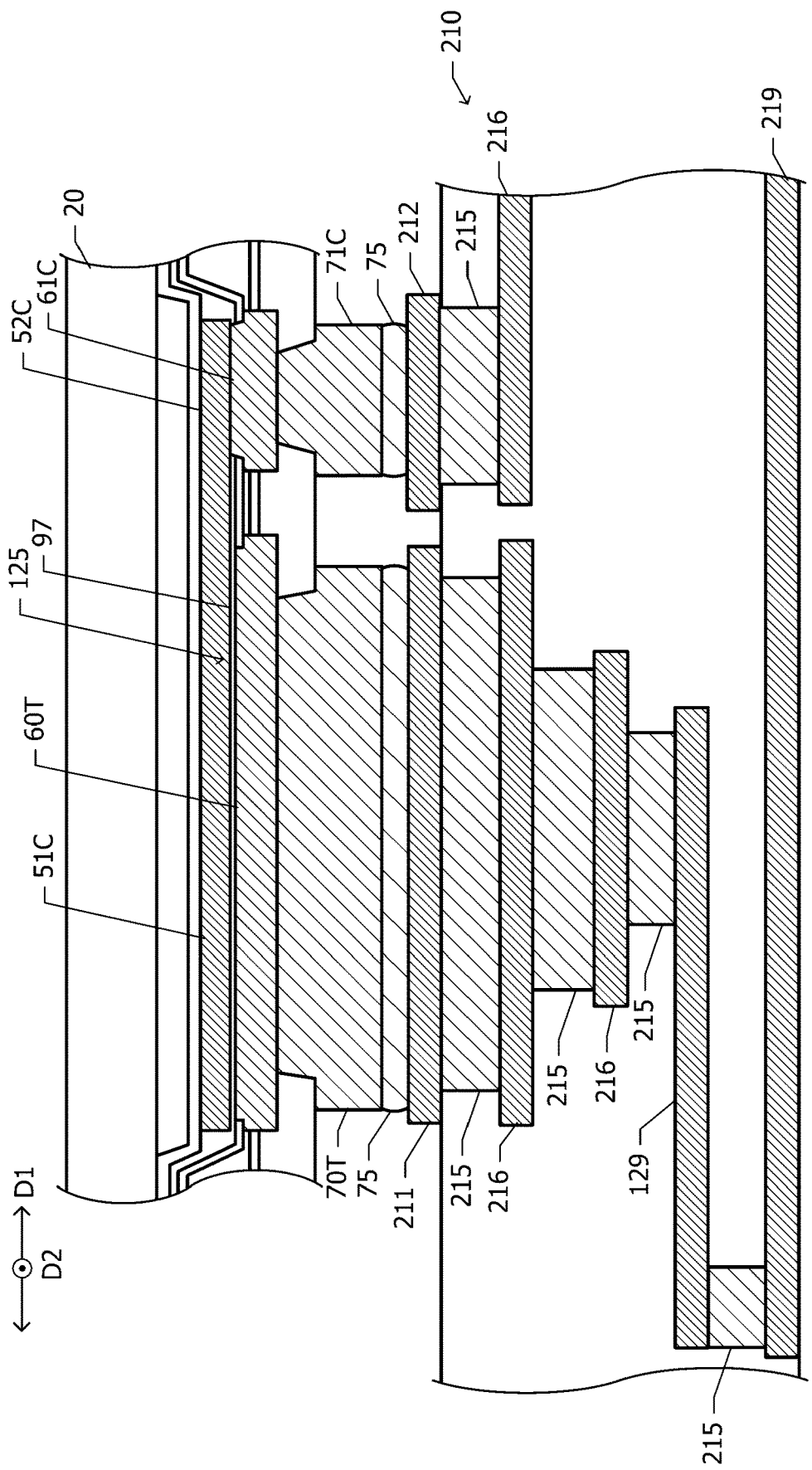
FIG. 22 is a cross-sectional view taken along a dashed-dotted line 22-22 in FIG. 21.

FIG. 22 is a cross-sectional view taken along a dashed-dotted line 22-22 in FIG. 21. The semiconductor chip 100 including the power stage amplification circuit 112 illustrated in FIG. 21 is flip-chip mounted on the mounting substrate 210. An output land 211 and a collector land 212 are provided on the mounting surface of the mounting substrate 210. The output bump 71T and the collector bump 71C of the semiconductor chip 100 are respectively connected to the output land 211 and the collector land 212 with the solder layers 75 interposed therebetween.

The mounting substrate 210 includes a plurality of wirings 216 arranged in inner layers, the inductor 129, and a ground plane 219 arranged on the surface (lower surface) thereof on the opposite side to the mounting surface. A plurality of via conductors 215 connects a plurality of conductor layers in the thickness direction. The output land 211 is connected to the inductor 129 with the plurality of via conductors 215 and wirings 216 interposed therebetween. The via conductors 215 connecting the output land 211 and the inductor 129 have substantially elongated shapes in one direction when seen from above. Such a via conductor may be referred to as a long diameter via.

The inductor 129 is connected to the ground plane 219 with the via conductor 215 interposed therebetween. That is, the output land 211 is grounded with the inductor 129 interposed therebetween. The inductor 129 is arranged so as to overlap with the output land 211 when seen from above. Further, in a state where the semiconductor chip is mounted on the mounting substrate 210, the inductor 129 overlaps with the output bump 71T and the output capacitor 125 when seen from above.

The output capacitor 125, the output bump 71T, and the inductor 129 correspond to the output capacitor 125, the output bump 71T, and the inductor 129 in the equivalent circuit diagram illustrated in FIG. 11, respectively.

Next, an excellent effect of the ninth embodiment will be described. In the ninth embodiment, the output capacitor 125 is incorporated in the semiconductor chip 100, and the inductor 129 is arranged in the inner layer of the mounting substrate 210. It is not therefore necessary to mount, on the mounting substrate 210, individual circuit components functioning as the output capacitor 125 and the inductor 129. Further, in the ninth embodiment, since the output capacitor 125 and the inductor 129 are arranged so as to overlap with the output land 211 and the output bump 71T when seen from above, the occupation area of the amplification circuit module when seen from above can be reduced.

Next, a variation of the ninth embodiment will be described.

In the ninth embodiment, the inductor 129 is arranged in the inner layer of the mounting substrate 210. However, a capacitor may be arranged instead of the inductor, or both of the inductor and the capacitor may be arranged. In other words, a passive element having at least one of inductance and capacitance may be arranged in the inner layer. In this case, it is preferable that the land on the mounting substrate side, which is connected to the bump of the semiconductor chip when seen from above, and the passive element be arranged so as to overlap with each other when seen from above.

It is needless to say that the embodiments described above are illustrative and partial substitutions or combinations of the configurations described in different embodiments are possible. Similar actions and effects with the same configurations in the plurality of embodiments are not described in each of the embodiments. Further, the present disclosure is not limited to the above-described embodiments. For example, it will be apparent to those skilled in the art that various changes, improvements, combinations, and the like can be made.

A collector current or a drain current flows through the transistors after passing through the first bump and the first wiring. When the first wiring is extended to the outer side portion of the region between the two transistor rows and the first bump is arranged in the extended portion, the collector current or the drain current flows through the first wiring in the first direction from the first bump to the transistors. When adopting the configuration as for the above aspect of the present disclosure, the collector current or the drain current flows through the two layers of the first bump and the first wiring in the first direction. Therefore, the flow path cross section of the path of the collector current or the drain current flowing in the first direction increases. As a result, it is possible to reduce parasitic resistance and parasitic inductance of the path of the collector current or the drain current.

While preferred embodiments of the disclosure have been described above, it is to be understood that variations and modifications will be apparent to those skilled in the art without departing from the scope and spirit of the disclosure.

The scope of the disclosure, therefore, is to be determined solely by the following claims.

What is claimed is:

1. A semiconductor device comprising:
   a substrate;
   two transistor rows that are provided on or in the substrate, each of the two transistor rows being configured by a plurality of transistors aligned in a first direction, and the two transistor rows being arranged at an interval in a second direction orthogonal to the first direction;
   a first wiring that is arranged in a region between the two transistor rows when seen from above and is connected to collectors or drains of the plurality of transistors in the two transistor rows; and
   at least one first bump that overlaps with the first wiring when seen from above, is arranged between the two transistor rows, and is connected to the first wiring,
   wherein the first bump does not overlap with the two transistor rows when seen from above.

2. The semiconductor device according to claim 1, wherein
   the first bump has a shape elongated in the first direction when seen from above.

3. The semiconductor device according to claim 1, wherein
   the first wiring extends toward at least one side in the first direction to an outer side portion of a region interposed between the two transistor rows when seen from above, and an extended portion extends in the second direction, and
   the semiconductor device further includes another first bump that overlaps with the extended portion when seen from above and is connected to the extended portion.

4. The semiconductor device according to claim 1, wherein
   the at least one first bump includes a plurality of first bumps,
   each of the first bumps has a shape elongated in the first direction, when seen from above, and
   adjacent ones of the first bumps are arranged at an interval in the second direction.

5. The semiconductor device according to claim 1, further comprising:
   at least one element selected from a group consisting of a transistor, a diode, a resistor element, a capacitor, and an inductor arranged closer to the substrate than the first bump in the region between the two transistor rows when seen from above.

6. The semiconductor device according to claim 1, further comprising:
   a second wiring that is arranged in a same wiring layer as the first wiring, a part of which is arranged in the region between the two transistor rows when seen from above, that partially overlaps with the first bump, and a remaining part of which extends to an outer side portion of the region between the two transistor rows;
   a first capacitor that is arranged in a region where the second wiring and the first bump overlap with each other when seen from above; and
   a second bump that is galvanically connected to the second wiring.

7. The semiconductor device according to claim 1, further comprising:
   a third wiring that is arranged in the same wiring layer as the first wiring, a part of which is arranged in the region between the two transistor rows when seen from above, that partially overlaps with the first bump, and a remaining part of which extends to an outer side portion of the region between the two transistor rows;
   a second capacitor that is arranged at a position overlapping with the third wiring when seen from above and connects the first bump and the third wiring; and
   a third bump that is arranged at a position overlapping with the third wiring when seen from above and is connected to the third wiring.

8. The semiconductor device according to claim 1, further comprising:
   a mounting substrate on which a semiconductor chip including the substrate is mounted;
   a land that is provided on or in a surface of the mounting substrate, which faces the semiconductor chip, and is connected to the first bump; and
   a passive element that is provided in an inner layer of the mounting substrate, is arranged at a position partially overlapping with the land when seen from above, and has at least one of capacitance and inductance.

9. The semiconductor device according to claim 2, wherein
   the first wiring extends toward at least one side in the first direction to an outer side portion of a region interposed between the two transistor rows when seen from above, and an extended portion extends in the second direction, and
   the semiconductor device further includes another first bump that overlaps with the extended portion when seen from above and is connected to the extended portion.

10. The semiconductor device according to claim 2, wherein
    the at least one first bump includes a plurality of first bumps,
    each of the first bumps has a shape elongated in the first direction, when seen from above, and
    adjacent ones of the first bumps are arranged at an interval in the second direction.

11. The semiconductor device according to claim 3, wherein
    the at least one first bump includes a plurality of first bumps,
    each of the first bumps has a shape elongated in the first direction, when seen from above, and
    adjacent ones of the first bumps are arranged at an interval in the second direction.

12. The semiconductor device according to claim 2, further comprising:
    at least one element selected from a group consisting of a transistor, a diode, a resistor element, a capacitor, and an inductor arranged closer to the substrate than the first bump in the region between the two transistor rows when seen from above.

13. The semiconductor device according to claim 3, further comprising:
    at least one element selected from a group consisting of a transistor, a diode, a resistor element, a capacitor, and an inductor arranged closer to the substrate than the first bump in the region between the two transistor rows when seen from above.

14. The semiconductor device according to claim 4, further comprising:
    at least one element selected from a group consisting of a transistor, a diode, a resistor element, a capacitor, and an inductor arranged closer to the substrate than the first bump in the region between the two transistor rows when seen from above.

15. The semiconductor device according to claim 2, further comprising:
   a second wiring that is arranged in a same wiring layer as the first wiring, a part of which is arranged in the region between the two transistor rows when seen from above, that partially overlaps with the first bump, and a remaining part of which extends to an outer side portion of the region between the two transistor rows;
   a first capacitor that is arranged in a region where the second wiring and the first bump overlap with each other when seen from above; and
   a second bump that is galvanically connected to the second wiring.

16. The semiconductor device according to claim 2, further comprising:
   a mounting substrate on which a semiconductor chip including the substrate is mounted;
   a land that is provided on or in a surface of the mounting substrate, which faces the semiconductor chip, and is connected to the first bump; and
   a passive element that is provided in an inner layer of the mounting substrate, is arranged at a position partially overlapping with the land when seen from above, and has at least one of capacitance and inductance.

17. The semiconductor device according to claim 3, further comprising:
   a mounting substrate on which a semiconductor chip including the substrate is mounted;
   a land that is provided on or in a surface of the mounting substrate, which faces the semiconductor chip, and is connected to the first bump; and
   a passive element that is provided in an inner layer of the mounting substrate, is arranged at a position partially overlapping with the land when seen from above, and has at least one of capacitance and inductance.

18. The semiconductor device according to claim 4, further comprising:
   a mounting substrate on which a semiconductor chip including the substrate is mounted;
   a land that is provided on or in a surface of the mounting substrate, which faces the semiconductor chip, and is connected to the first bump; and
   a passive element that is provided in an inner layer of the mounting substrate, is arranged at a position partially overlapping with the land when seen from above, and has at least one of capacitance and inductance.

19. The semiconductor device according to claim 5, further comprising:
   a mounting substrate on which a semiconductor chip including the substrate is mounted;
   a land that is provided on or in a surface of the mounting substrate, which faces the semiconductor chip, and is connected to the first bump; and
   a passive element that is provided in an inner layer of the mounting substrate, is arranged at a position partially overlapping with the land when seen from above, and has at least one of capacitance and inductance.

20. A semiconductor device comprising:
   a substrate;
   two transistor rows provided on or in the substrate, each of the two transistor rows being configured by a plurality of transistors aligned in a first direction, and the two transistor rows being arranged at an interval in a second direction orthogonal to the first direction;
   a first wiring that is arranged in a region between the two transistor rows when seen from above and is connected to collectors or drains of the plurality of transistors in the two transistor rows;
   at least one fourth bump that overlaps with the first wiring when seen from above, is arranged between the two transistor rows, and is connected to the first wiring;
   a first capacitor that includes a capacitor dielectric film arranged between the fourth bump and the first wiring and connects the fourth bump and the first wiring;
   a mounting substrate on which a semiconductor chip including the substrate is mounted;
   a land that is provided on a surface of the mounting substrate, which faces the semiconductor chip, and is connected to the fourth bump;
   a ground plane that is provided on or in the mounting substrate; and
   an inductor that is provided on or in the mounting substrate, connects the land and the ground plane, and is arranged at a position partially overlapping with the land when seen from above,
   wherein the fourth bump does not overlap with the two transistor rows when seen from above.

* * * * *